United States Patent
Pehlivan et al.

(10) Patent No.: US 11,813,757 B2
(45) Date of Patent: Nov. 14, 2023

(54) CENTERFINDING FOR A PROCESS KIT OR PROCESS KIT CARRIER AT A MANUFACTURING SYSTEM

(71) Applicant: APPLIED MATERIALS, INC., Santa Clara, CA (US)

(72) Inventors: Ali Utku Pehlivan, San Jose, CA (US); Mohsin Waqar, Oakland, CA (US); Paul Zachary Wirth, Kalispell, MT (US); Todd James Brill, Denver, CO (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 517 days.

(21) Appl. No.: 17/069,431

(22) Filed: Oct. 13, 2020

(65) Prior Publication Data
US 2022/0111529 A1    Apr. 14, 2022

(51) Int. Cl.
  *B25J 9/16* (2006.01)
(52) U.S. Cl.
  CPC .................. *B25J 9/1692* (2013.01)
(58) Field of Classification Search
  CPC ........ B25J 9/1692; B25J 9/1694; B25J 13/08; H01L 21/67259; H01L 21/681; H01L 21/68707; G05B 2219/37608; G05B 2219/37286; G05B 2219/37359; Y02P 90/02
  See application file for complete search history.

(56) References Cited

U.S. PATENT DOCUMENTS

| | | | |
|---|---|---|---|
| 4,819,167 A | 4/1989 | Cheng et al. | |
| 6,327,517 B1 * | 12/2001 | Sundar | H01L 21/681 318/560 |
| 6,556,887 B2 | 4/2003 | Freeman et al. | |
| 7,039,501 B2 | 5/2006 | Freeman et al. | |
| 2003/0014158 A1 * | 1/2003 | Berger | H01L 21/68 700/218 |
| 2005/0137751 A1 * | 6/2005 | Cox | H01L 21/67259 700/254 |

(Continued)

FOREIGN PATENT DOCUMENTS

WO    2007103896 A1    9/2007

OTHER PUBLICATIONS

PCT International Search Report and Written Opinion for International Application No. PCTUS2021054628 dated Jan. 28, 2022, 13 pages.

*Primary Examiner* — Robert T Nguyen
(74) *Attorney, Agent, or Firm* — Lowenstein Sandler LLP

(57) ABSTRACT

A method for finding a center of a process kit and/or a process kit ring is provided. An object placed on an end effector is moved past a sensor of a manufacturing system. A first signal indicating a current shape of object is received from the sensor of the manufacturing system. A determination is made whether the first signal corresponds to a second signal indicating a predefined shape for a process kit and/or a process kit carrier. In response to a determination that the first signal corresponds to the second signal, a coordinate correspondence is determined between coordinates of a center of the object and coordinates of a center of the end effector. The determined coordinate correspondence indicates whether a current placement of the object on the end effector satisfies a target placement criterion.

20 Claims, 9 Drawing Sheets

(56) References Cited

U.S. PATENT DOCUMENTS

| | | |
|---|---|---|
| 2005/0156122 A1 | 7/2005 | Radahl |
| 2010/0085582 A1 | 4/2010 | Weniger et al. |
| 2010/0272347 A1* | 10/2010 | Rodnick ............... H01L 21/681 |
| | | 382/153 |
| 2010/0277749 A1 | 11/2010 | Rodnick et al. |
| 2014/0340509 A1 | 11/2014 | Fairbairn |

* cited by examiner

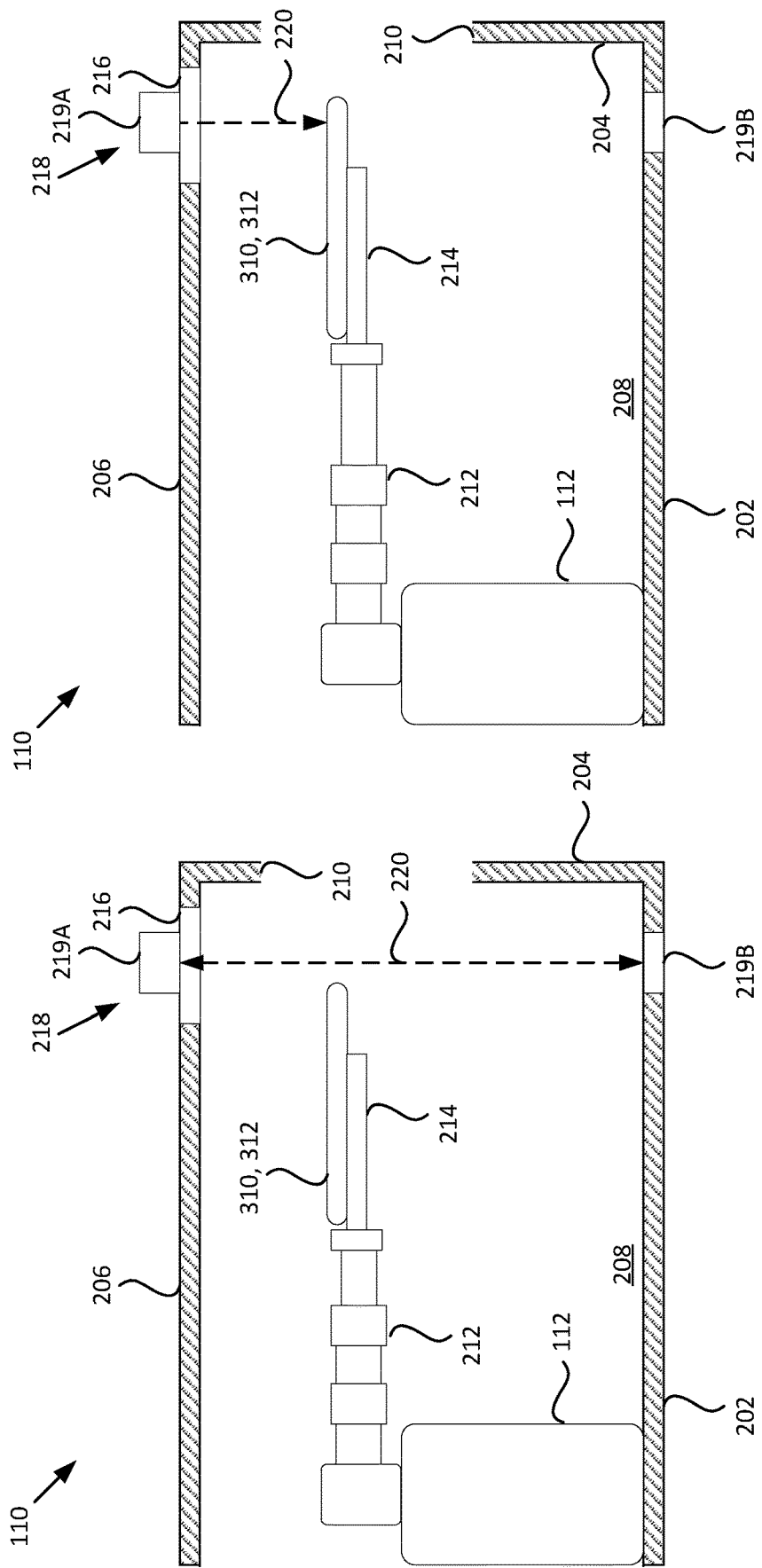

400

```
┌─────────────────────────────────────────────────────────────────────────────────┐
│ Place a process kit and/or carrier at a target location of an end effector of a robot arm 410 │
└─────────────────────────────────────────────────────────────────────────────────┘
                                        │
                                        ▼
┌─────────────────────────────────────────────────────────────────────────────────┐
│ Move the process kit and/or carrier near a set of sensors at the manufacturing system 420 │
└─────────────────────────────────────────────────────────────────────────────────┘
                                        │
                                        ▼
┌─────────────────────────────────────────────────────────────────────────────────┐
│        Receive a signal indicating a shape of the process kit and/or carrier 430         │
└─────────────────────────────────────────────────────────────────────────────────┘
                                        │
                                        ▼
┌─────────────────────────────────────────────────────────────────────────────────┐
│           Store signal indicating shape of process kit and/or carrier at data store 440           │
└─────────────────────────────────────────────────────────────────────────────────┘
```

FIG. 4

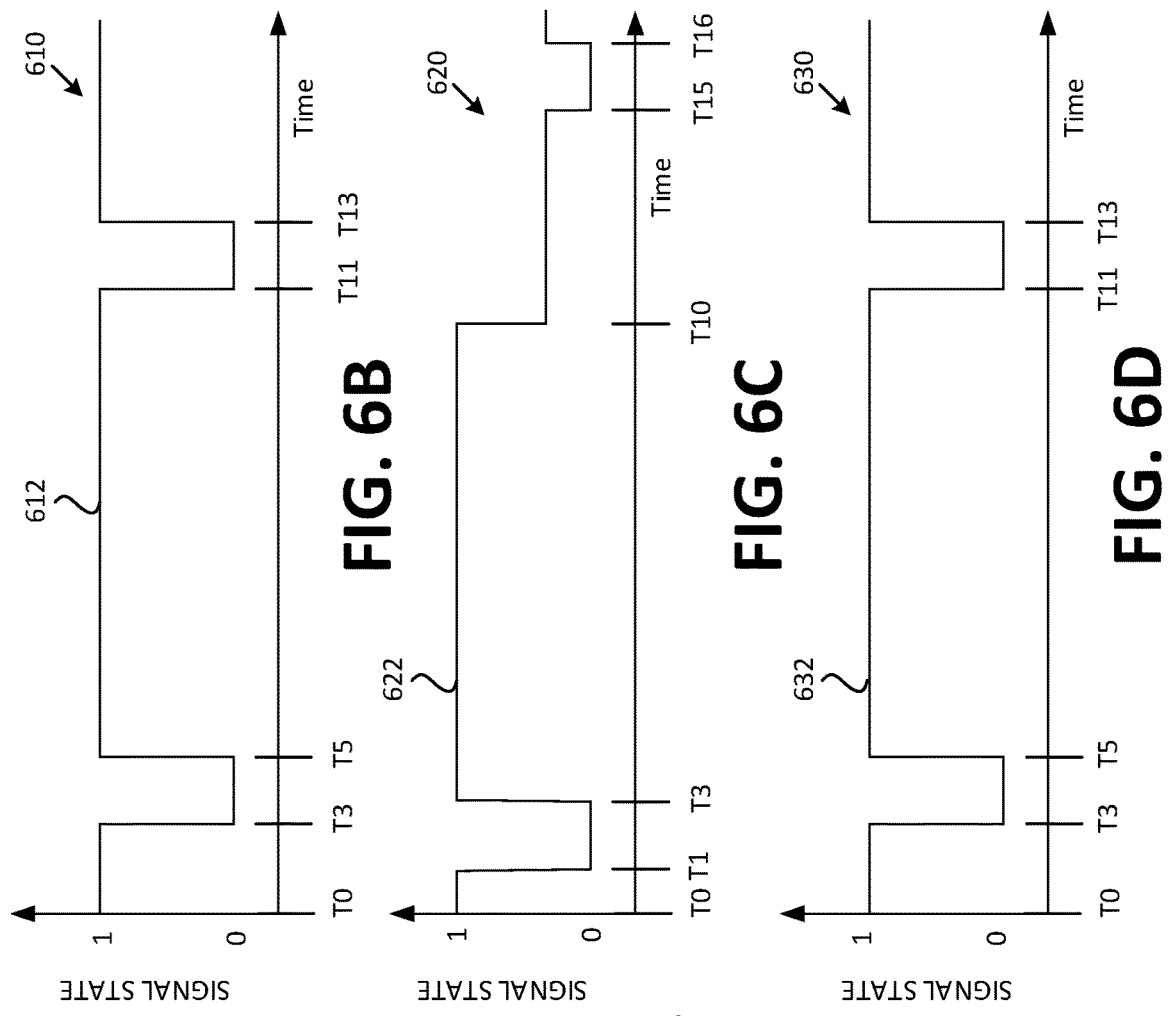
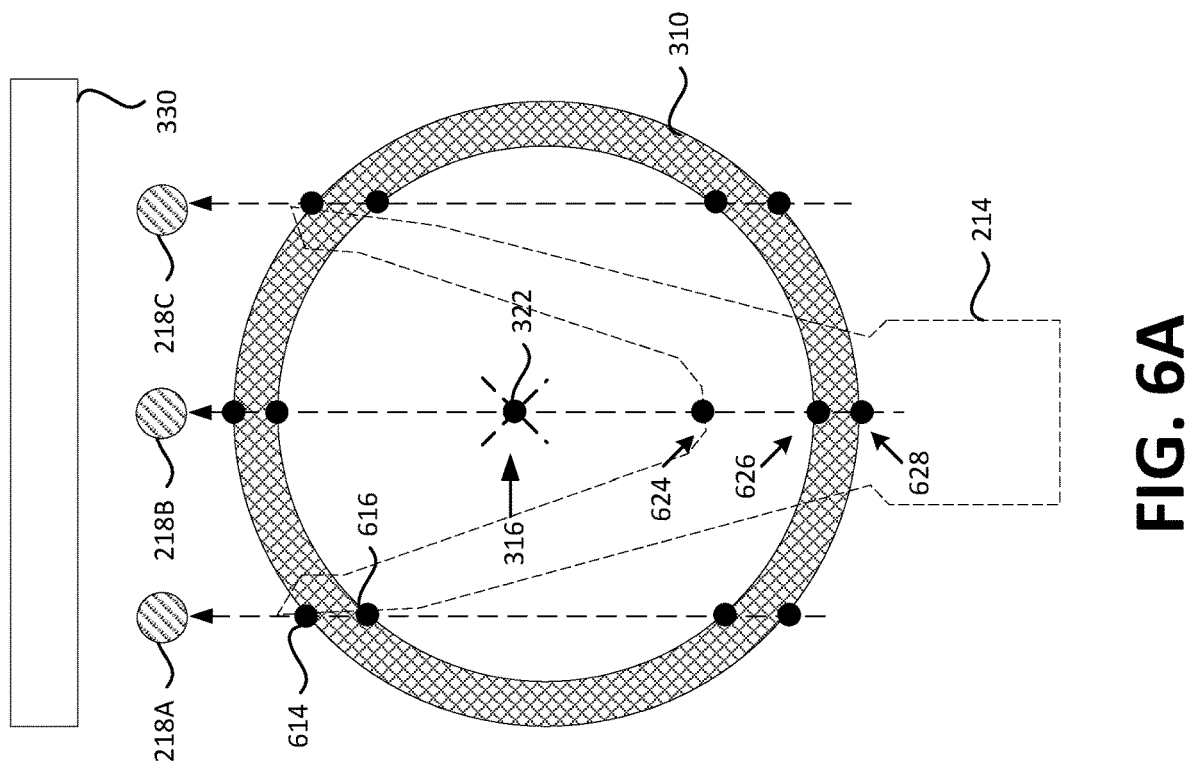

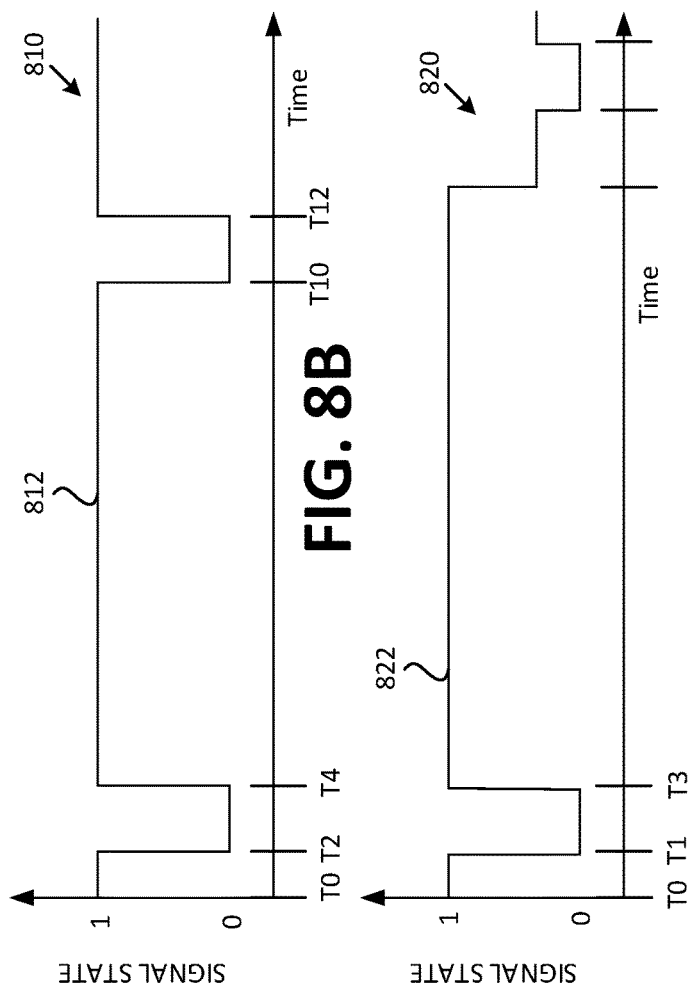
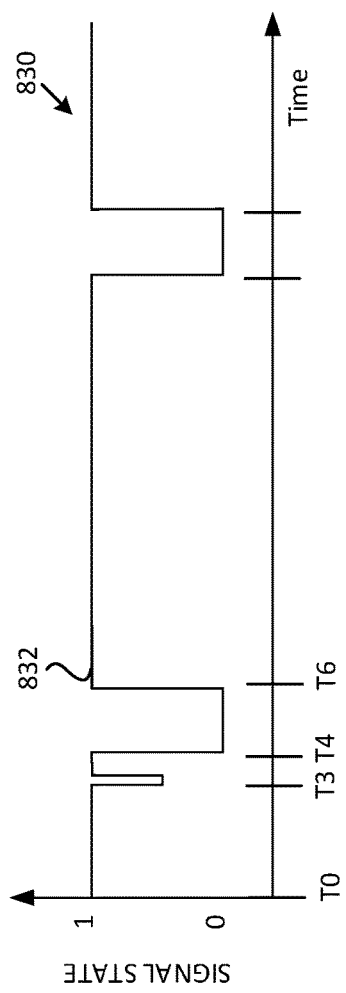
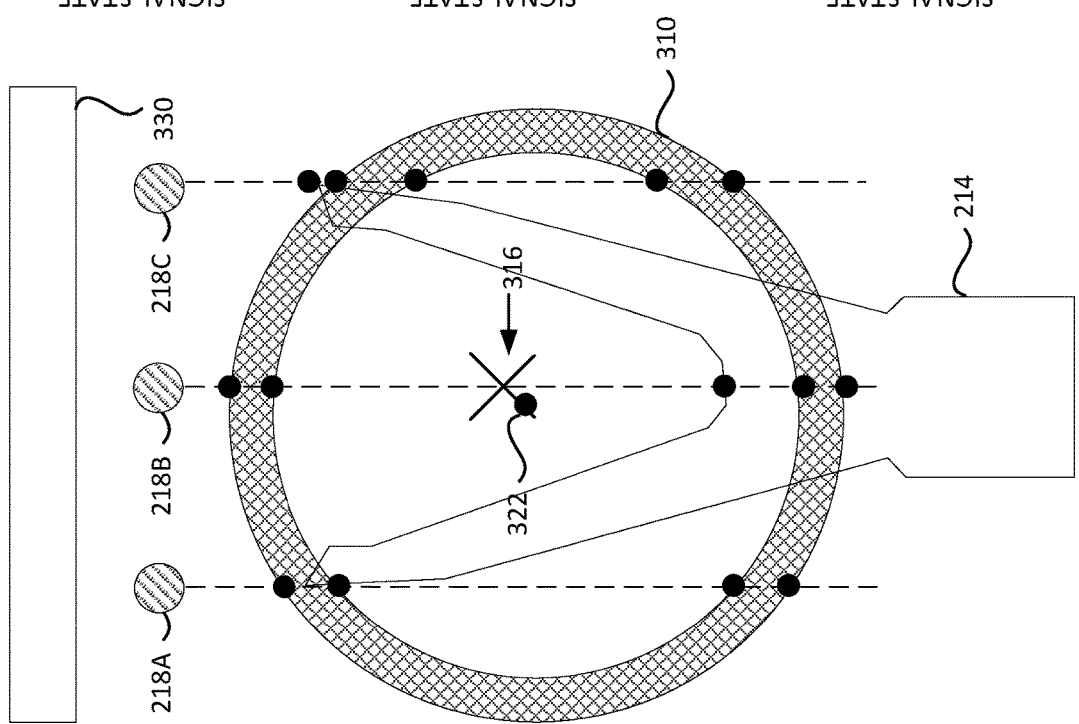
FIG. 8A
FIG. 8B
FIG. 8C
FIG. 8D

CENTERFINDING FOR A PROCESS KIT OR PROCESS KIT CARRIER AT A MANUFACTURING SYSTEM

TECHNICAL FIELD

Embodiments of the present disclosure relate, in general, to a manufacturing system and more particularly to finding a center of a process kit or a process kit carrier at a manufacturing system.

BACKGROUND

The accurate positioning of substrates and other substrate processing components (e.g., process kits, process kit carriers, etc.) at stations of a manufacturing system is helpful in maintaining a quality and consistency of substrates processed at the manufacturing system. For example, a robot of a manufacturing system can move a process kit and a process kit carrier to a station of the manufacturing system to engage with a substrate at that station. If the robot does not accurately position the process kit and process kit carrier at the station (e.g., to correspond with the positioning of the substrate at the station), the process kit and process kit carrier does not engage with the process kit and, instead, the substrate can be damaged.

SUMMARY

Some embodiments described cover a method including moving an object placed on an end effector past a set of sensors of a manufacturing system. The method also includes receiving, from the set of sensors of the manufacturing system, a first set of signals each indicating a current shape of the object placed on the end effector. The method also includes determining whether each of the first set of signals correspond to one of a second set of signals, where each of the second set of signals indicate a predefined shape for at least one of a process kit or a process kit carrier. The method also includes, responsive to determining each of the first set of signals correspond to a respective signal of the second set of signals, determining a correspondence between a center of the object and a center of the end effector. The determined correspondence indicates whether a current placement of the object on the end effector satisfies a target placement criterion.

In some embodiments, a manufacturing system includes a robot arm including an end effector, and a controller operatively coupled to the robot arm. The controller is to perform operations including moving an object placed on an end effector of the robot arm past a set of sensors of a manufacturing system. The controller is also to perform operations including receiving, from the set of sensors of the manufacturing system, a first set of signals each indicating a current shape of the object placed on the end effector. The controller is also to perform operations including determining whether each of the first set of signals correspond to one of a second set of signals, where each of the second set of signals indicate a predefined shape for at least one of a process kit or a process kit carrier. The controller is also to perform operations including, responsive to determining each of the first set of signals correspond to a respective signal of the second set of signals, determining a correspondence between a center of the object and a center of the end effector. The determined correspondence indicates whether a current placement of the object on the end effector satisfies a target placement criterion.

In some embodiments, a non-transitory computer readable medium includes instructions that, when executed by a processing device, cause the processing device to perform operations including moving an object placed on an end effector past a set of sensors of a manufacturing system. The processing device is also to perform operations including receiving, from the set of sensors of the manufacturing system, a first set of signals each indicating a current shape of the object placed on the end effector. The processing device is also to perform operations including determining whether each of the first set of signals correspond to one of a second set of signals, where each of the second set of signals indicate a predefined shape for at least one of a process kit or a process kit carrier. The processing device is also to perform operations including, responsive to determining each of the first set of signals correspond to a respective signal of the second set of signals, determining a correspondence between a center of the object and a center of the end effector. The determined correspondence indicates whether a current placement of the object on the end effector satisfies a target placement criterion.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2A-2B illustrate a side view of a station of a manufacturing system including one or more sensors, according to aspects of the present disclosure.

FIG. 4 is a flow chart of a method for obtaining a signal indicating a shape of a process kit and/or a process kit carrier, according to aspects of the present disclosure.

FIG. 6A illustrates sensors of a manufacturing system detecting a substrate process kit at a target placement on an end effector, according to aspects of the present disclosure.

FIGS. 6B-6D illustrate signals generated by sensors at an entrance of a station of the manufacturing system, according to aspects of the present disclosure.

FIG. 8A illustrates sensors of a manufacturing system detecting a process kit on an end effector of a robot arm, according to aspects of the present disclosure.

FIGS. 8B-8D illustrate signals generated by sensors at an entrance of a station of the manufacturing system, according to aspects of the present disclosure.

DETAILED DESCRIPTION OF EMBODIMENTS

Figure 1:
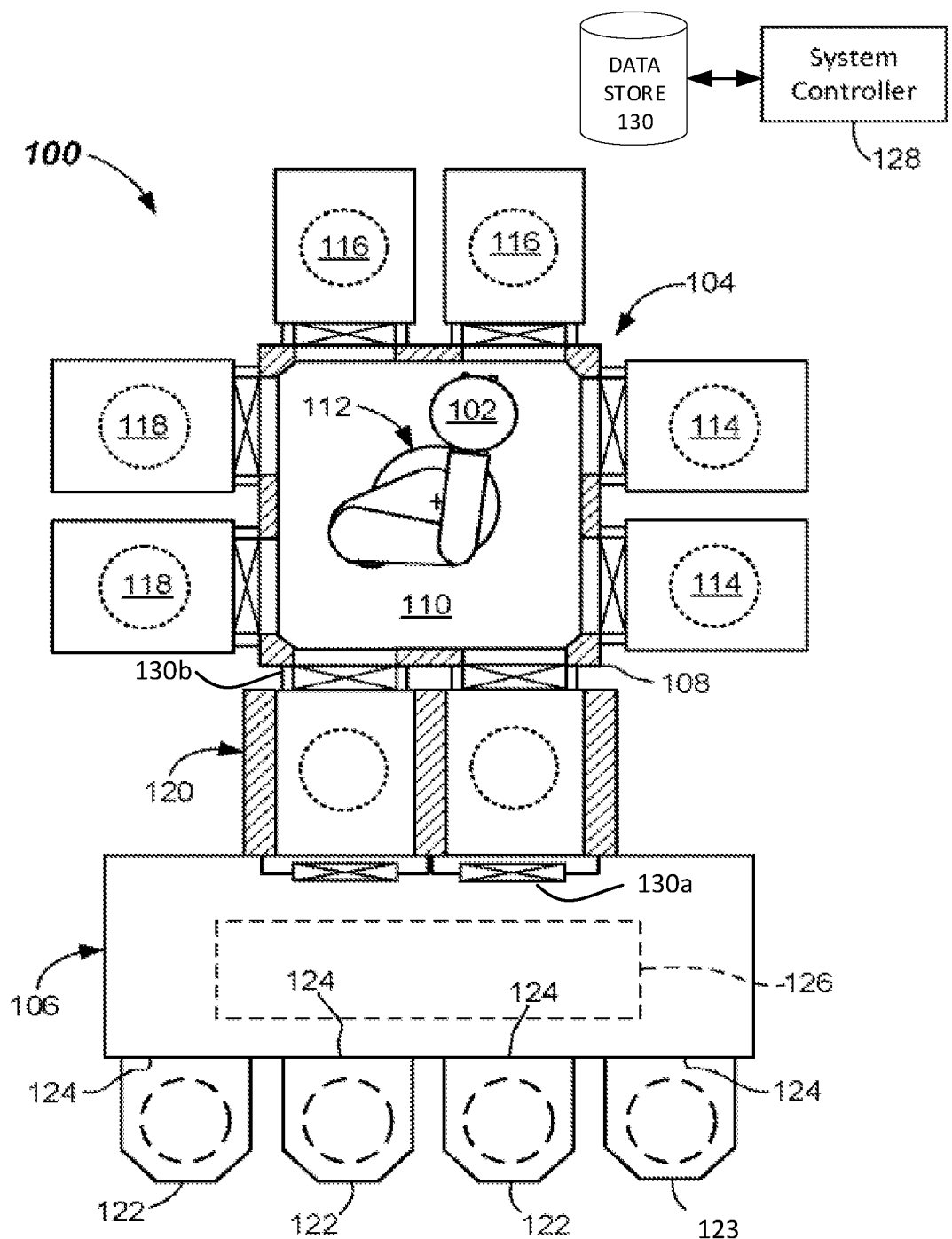
FIG. 1 is a top schematic view of an example manufacturing system, according to aspects of the present disclosure.

Embodiments descried herein are related to methods and systems for finding a center of a process kit or a process kit carrier at a manufacturing system. A process kit (also referred to a process ring or an edge ring) can be placed at a processing chamber of a manufacturing system to maintain a substrate at a particular location and/or position during processing. Over time, a process kit can begin to degrade and can be replaced with a new process kit. In some embodiments, an end effector of a robot arm can engage with one or more portions of a process kit (i.e., being removed from a processing chamber or being moved into a processing chamber) and robot arm can move the process kit ring to various stations of the manufacturing system. In other or similar embodiments, a process kit ring carrier (referred to as a carrier) can engage with the process kit ring. The end effector of the robot arm can engage with the carrier to move the process kit into or out of a processing chamber.

The process kit is placed at a particular location within the processing chamber (referred to as a target location). If a process kit is not placed at the target location prior to a process performed at the processing chamber, the process kit may not successfully maintain the substrate at the particular location and/or position during processing, and the substrate can include a significant number of defects. The process kit and/or carrier can be placed at a particular placement on the end effector (referred to as a target placement) to enable the end effector to place the process kit at the target location. A process kit and/or carrier can be placed at the target position relative to a center of the end effector. For example, the process kit and/or carrier are placed at the target position at the end effector if a center of the process kit and/or carrier correspond to (i.e., approximately aligns with) the center of the end effector.

Conventionally, manufacturing systems attempt to place a process kit and/or carrier at a target placement of an end effector as the end effector engages with the process kit and/or carrier. However, the placement of the process kit and/or carrier can shift as the end effector is transferring the process kit and/or carrier to or away from a processing chamber. If the process kit and/or carrier are at the target placement of the end effector as the end effector initiates placement of the process kit, the end effector may not place the process kit at the target location at the processing chamber. Additionally, if the process kit and/or carrier are at the target placement as the robot arm moves the process kit and/or carrier to the processing chamber, the process kit and/or carrier can become dislodged from the end effector or can damage other equipment of the manufacturing system. Such damage can be difficult and expensive to correct, which can cause at least portions of a manufacturing system to be unusable for a significant period of time. If a portion of the manufacturing system is unusable for a significant period of time, an overall efficiency and yield for the manufacturing system can decrease.

The methods and systems herein use sensors located at various stations of a manufacturing system to detect a placement of a process kit and/or carrier on an end effector before the end effector places the process kit and/or carrier at a particular station (e.g., a processing chamber) of the manufacturing system. In some embodiments, a set of sensors can be disposed at an entrance of a station of a manufacturing system and each sensor can include a first element and a second element. The end effector can move a process kit and/or a carrier between the first element and second element when moving the process kit and/or carrier towards or away from the entrance of the station. Each sensor can detect whether the end effector or process kit and/or carrier are blocking a signal transmitted between the first element and the second element as the end effector moves the process kit and/or carrier and can transmit data to a system controller indicating whether a signal for the respective sensor is blocked or the signal for the respective is unblocked. The system controller receives the data from each sensor and determine whether a shape of a signal for each sensor corresponds to a respective signal indicating a predefined shape for the process kit and/or carrier. In response to determining each signal for each signal corresponds to a respective signal, the system controller determines a correspondence between a center of the process kit and/or carrier. The determined correspondence indicates whether the placement of the process kit and/or carrier on the end effector satisfies a target placement criterion. The system controller can determine, based on the determined correspondence, whether an adjustment to a process recipe for the robot arm can be made to cause the end effector to place the process kit and/or carrier at a target location at the station. In response to determining the adjustment can be made, the system controller can make the adjustment to cause the end effector to place the process kit and/or carrier at the target location. If the system controller determines an adjustment cannot be made, the system controller can transmit a message to an operator of the manufacturing system indicating that the process kit and/or carrier cannot be placed at the target location of the station.

Embodiments of the present disclosure address the above mentioned deficiencies of conventional systems because the present embodiments enable a system controller of a manufacturing system to make on-the-fly adjustments to a process recipe for a robot arm before an end effector places a process kit and/or carrier at a station. The sensors located at the entrance of the station are enabled to detect a current shape of the process kit and/or carrier. The system controller can identify a center of the process kit and/or carrier based on the detected current shape and determine, based on the identified center, whether the process kit and/or carrier is placed at a target placement on the end effector. The system controller can determine whether an adjustment to the process recipe for the robot arm can be made, based on the placement of the process kit and/or carrier on the end effector, to enable the end effector to place the process kit and/or carrier at a target location at the station. By adjusting the process recipe for the robot arm, based on the determined placement of the process kit and/or carrier on the end effector, a likelihood that the end effector will place the process kit and/or carrier at the target location of the station is increased. For each process kit that is placed at the target location of a processing chamber, a number of defects for a substrate processed at the processing chamber decreases. As a result, an overall efficiency and overall yield of the manufacturing system increases. Further, the system controller can determine, in some instances, that an adjustment cannot be made to a process recipe for the robot arm to enable the end effector to place the process kit at the target location of the station and can transmit an error message to an operator of the manufacturing system. As the system controller transmits the error message to the operator and does not attempting to place the process kit at the target location, a likelihood that the process kit and/or carrier will be dislodged from the end effector and/or damage equipment of the manufacturing system decreases. As a result, an overall number of expensive repairs to the manufacturing system decreases and an overall total operating time for each portion of the manufacturing system increases.

FIG. 1 is a top schematic view of an example manufacturing system, according to aspects of the present disclosure. Manufacturing system 100 can perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 100 can include a process tool 104 and a factory interface 106 coupled to process tool 104. Process tool 104 can include a housing 108 having a transfer chamber 110 therein. Transfer chamber 110 can include one or more process chambers (also referred to as processing chambers) 114, 116, 118 disposed therearound and coupled thereto. Process chambers 114, 116, 118 can be coupled to transfer chamber 110 through respective ports, such as slit valves or the like.

Process chambers 114, 116, 118 can be adapted to carry out any number of processes on substrates 102. A same or different substrate process can take place in each process chamber 114, 116, 118. A substrate process can include atomic layer deposition (ALD), physical vapor deposition (PVD), chemical vapor deposition (CVD), etching, annealing, curing, pre-cleaning, metal or metal oxide removal, or the like. In one example, a PVD process can be performed in one or both of process chambers 114, an etching process can be performed in one or both of process chambers 116, and an annealing process can be performed in one or both of process chambers 118. Other processes can be carried out on substrates 102 therein. Process chambers 114, 116, 118 can each include a substrate support assembly. The substrate support assembly can be configured to hold substrate 102 in place while a substrate process is performed.

As described above, an etching process can be performed at one or more process chambers 114, 116, 118. As such, some process chambers 114, 116, 118 (such as etch chambers) can include process kits (also referred to as edge rings or process kit rings) that are placed at a surface of the substrate support assembly. An exemplary process kit can include process kit 310 of FIG. 3B. In some embodiments, the process kits can occasionally undergo replacement. While replacement of a process kit in conventional system includes disassembly of a process chamber 114, 116, 118 by an operator to replace the process kit, manufacturing system 100 can be configured to facilitate replacement of process kits without disassembly of a process chamber 114, 116, 118 by an operator.

In some embodiments, a process chamber 114, 116, 118 can include a carousel (also referred to as a susceptor). The carousel can be disposed in an interior volume of the process chamber 114, 116, 118 and can be configured to rotate about an axial center at the process chamber 114, 116, 118 during a process (e.g., a deposition process) to ensure process gases are evenly distributed. In some embodiments, the carousel can include one or more end effectors configured to handle one or more objects. For example, the end effectors can be configured to hold a substrate, a process kit, and/or a process kit carrier. One or more sensors can be disposed at the process chamber 114, 116, 118 and can be configured to detect a placement of an object on an end effector of the carousel, in accordance with embodiments described herein.

Transfer chamber 110 can also include a transfer chamber robot 112. Transfer chamber robot 112 can include one or multiple arms where each arm includes one or more end effectors at the end of each arm. The end effector can be configured to handle particular objects, such as substrates. Alternatively, or additionally, the end effector can be configured to handle process kits (i.e., using a process kit carrier). In some embodiments, transfer chamber robot 112 can be a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106. Load lock 120 can have an environmentally-controlled atmosphere that can be changed from a vacuum environment (wherein substrates can be transferred to and from transfer chamber 110) to an at or near atmospheric-pressure inert-gas environment (wherein substrates can be transferred to and from factory interface 106) in some embodiments. In some embodiments, load lock 120 can be a stacked load lock having a pair of upper interior chambers and a pair of lower interior chambers that are located at different vertical levels (e.g., one above another). In some embodiments, the pair of upper interior chambers can be configured to receive processed substrates from transfer chamber 110 for removal from process tool 104, while the pair of lower interior chambers can be configured to receive substrates from factory interface 106 for processing in process tool 104. In some embodiments, load lock 120 can be configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 can be configured to receive replacement parts (e.g., process kits) from replacement parts storage containers 123. Factory interface robot 126 can include one or more robot arms and can be or include a SCARA robot. In some embodiments, factory interface robot 126 can have more links and/or more degrees of freedom than transfer chamber robot 112. Factory interface robot 126 can include an end effector on an end of each robot arm. The end effector can be configured to pick up and handle specific objects, such as substrates or process kits. Alternatively, or additionally, the end effector can be configured to handle objects such as process kits (e.g., using process kit carriers).

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 can be maintained at a vacuum level. Manufacturing system 100 can include one or more vacuum ports that are coupled to one or more stations of manufacturing system 100. For example, first vacuum ports 130*a* can couple factory interface 106 to load locks 120. Second vacuum ports 130*b* can be coupled to load locks 120 and disposed between load locks 120 and transfer chamber 110.

In some embodiments, one or more sensors can be included at one or more stations of manufacturing system 100. For example, one or more sensors can be included in transfer chamber 110 at or near a port (i.e., an entrance) of process chambers 114, 116, 118. An end effector of a robot arm (e.g., of transfer chamber robot 112) can move a substrate 102 or a process kit (i.e. using a process kit carrier) past the one or more sensors when moving the substrate 102 and/or process kit into or out of a process chamber 114, 116, 118. Each sensor can be configured to detect the substrate 102 or the process kit and/or carrier as the end effector moves the substrate 102 or the process kit and/or carrier into or out of the process chamber 114, 116, 118. Each sensor can be further configured to detect a shape of the substrate 102 and/or process kit on the end effector as the end effector moves into or out of the process chamber 114, 116, 118. Further details regarding the one or more sensors are provided herein.

Manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions).

In one embodiment, system controller 128 can execute instructions to cause an end effector of a robot arm (e.g., of transfer chamber robot 112) to move an object (i.e., a substrate 102 and/or a process kit) from a first station (e.g., load lock 120) of manufacturing system 100 to a second station (e.g., process chamber 114, 116, 118) of manufacturing system 100. In response to executing the instructions to move the object from the first station to the second station, system controller 128 can receive a set of signals from one or more sensors included at an entrance to the first station or the second station. Each signal can indicate a current shape of the object placed at the end effector of the robot arm. In some embodiments, system controller 128 can determine a position of the object placed at the end effector of the robot arm based on each signal received from the one or more sensors. For example, system controller 128 can compare the current shape of a process kit and/or carrier to a predefined shape for the process kit and/or carrier to determine whether the current shape corresponds to the predefined shape for the process kit and/or carrier. In response to determining the current shape corresponds to the predefined shape for the process kit and/or carrier, system controller 128 can identify a first set of coordinates, based on the received signals, that correspond to a center of the process kit and/or carrier. System controller 128 can compare the first set of coordinates corresponding to the center of the process kit and/or carrier to a second set of coordinates corresponding to a center of the end effector to determine a correspondence between the first set of coordinates and the second set of coordinates. System controller 128 can determine whether the center of the process kit and/or carrier is placed at a target position relative to the center of the end effector based on the determined coordinate correspondence, in accordance with embodiments described herein.

It should be noted that, although embodiments of the present disclosure are directed to identifying a center of a process kit and/or carrier placed on an end effector of a robot arm (e.g., of a transfer chamber robot or a factory interface robot), embodiments of the present disclosure can be applied to identifying a center of a process kit and/or carrier placed on other components of a manufacturing system. For example, a process kit and/or carrier can be placed on an end effector of a rotating carousel or a rotating susceptor at a process chamber 114, 116, 118, in accordance with embodiments described herein. One or more sensors can be disposed within the process chamber to detect a position of the process kit and/or carrier on the rotating carousel, in accordance with previously described embodiments. The one or more sensors can transmit signals to system controller 128, as previously described, and system controller 128 can detect a center of the process kit and/or carrier on the rotating susceptor based on the received signals, in accordance with embodiments described herein.

FIGS. 2A-2B illustrate a side view of a station of a transfer chamber 110 including one or more sensors 218, according to aspects of the present disclosure. It should be noted that, although some embodiments of the present disclosure include the one or more sensors 218 included in transfer chamber 110, the one or more sensors 218 can be included in any station of manufacturing 100. For example, the one or more sensors 218 can be included in factory interface 106 at an entrance of load lock 120 and/or an entrance of substrate carriers 122 or replacement parts storage container 123. In another example, the one or more sensors 218 can be disposed within a process chamber 114, 116, 118 of manufacturing system 100.

The illustrative transfer chamber 110 generally includes a bottom 202, side walls 204, and a lid 206 that encloses a process volume 208. In some embodiments, a process chamber, such as process chamber 114, 116, 118 of FIG. 1, can be coupled (e.g., bolted) to an exterior of transfer chamber 110. A port 210 to the process chamber can be provided between the transfer chamber 110 and the process chamber. In some embodiments, a door can be provided within the port 210 to the process chamber, which can seal off an environment of the process chamber from an environment of the transfer chamber during a manufacturing process (e.g., an etch process).

As discussed with respect to FIG. 1, transfer chamber 110 can include a transfer chamber robot 112. As discussed previously, transfer chamber robot 112 can include a robot arm 212 and an end effector 214 at an end of the robot arm 212. In additional or alternative embodiments, end effector 214 can be part of a rotating carousel of a process chamber 114, 116, 118, as previously described. Transfer chamber robot 112 can be configured to transfer substrates 102, process kits, carriers, and so forth, between transfer chamber 110 and the process chamber 114, 116, 118. For example, the end effector 214 of the robot arm 212 can pick up a process kit and/or a carrier (e.g., process kit 310 and/or carrier 312 of FIG. 3B) from a load lock 120 of manufacturing system 100 and move the process kit 310 and/or carrier 312 into the transfer chamber 110. It should be noted that, although some embodiments of the present disclosure are directed to a transfer chamber robot 112, embodiments of the present disclosure can apply to any robot included in a manufacturing system (e.g., factory interface robot 126). It should also be noted that embodiments of the present disclosure can apply to any robot operating in a vacuum environment or a non-vacuum environment.

In some embodiments, transfer chamber robot 112 can transfer process kit 310 and/or carrier 312 between transfer chamber 110 and process chamber 114, 116, 118 through port 210. The port 210 can be selectively sealed by a valve (e.g., a slit valve) to isolate the environment of the transfer chamber 110 from the environment of the process chamber 114, 116, 118. It should be noted that, although some embodiments of the present disclosure are directed to transfer chamber robot 112 moving process kit 310 and/or carrier 312 between transfer chamber 110 and the process chamber, embodiments of the present disclosure can be applied to the transfer of any object (e.g., substrates 102, etc.) between transfer chamber 110 and the process chamber.

As discussed previously, the end effector 214 of the robot arm 212 can pick up process kit 310 and/or carrier 312 from a first station of manufacturing system 100 and move process kit 310 and/or carrier 312 to a second station of manufacturing system 100. Additionally or alternatively, the end effector 214 of the rotating carousel can pick up process kit 310 and/or carrier 312 within process chamber 114, 116, 118. The rotating carousel can cause process kit 310 and/or carrier 312 placed on the end effector 214 to rotate within process chamber 114, 116, 118.

Figure 3B:
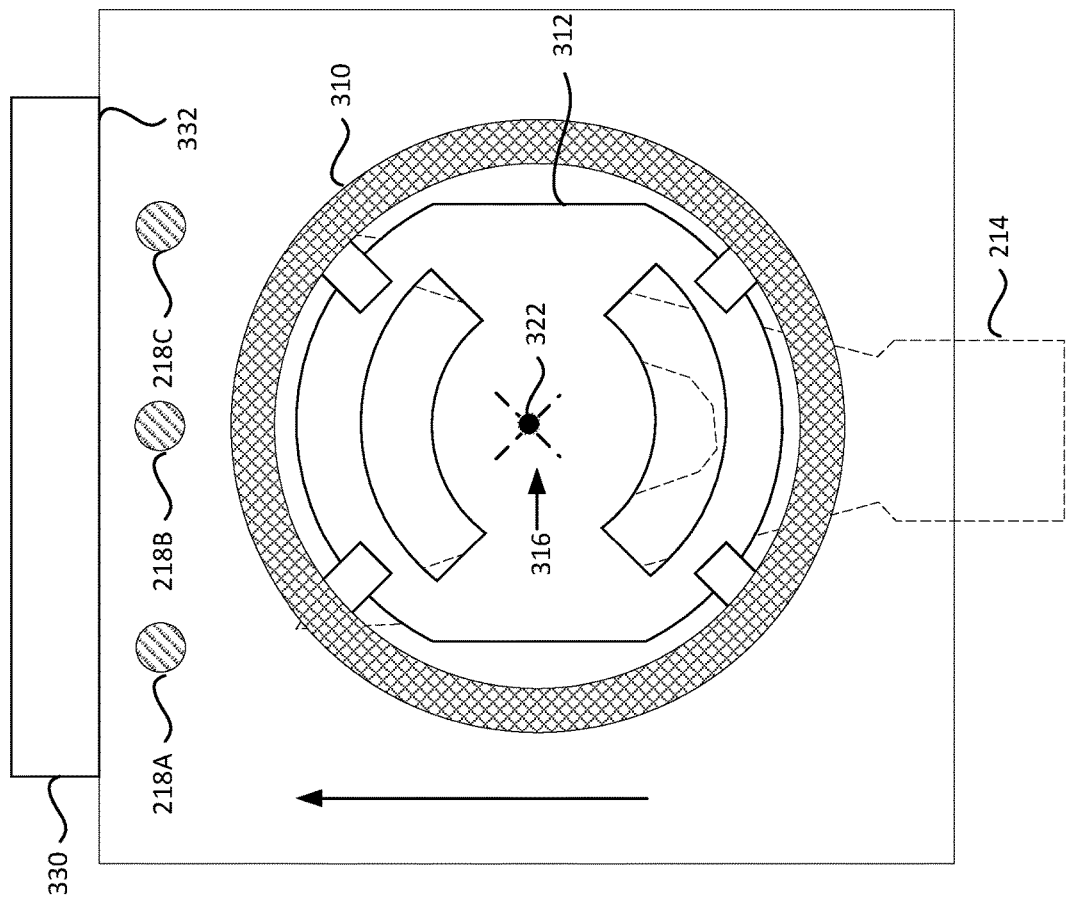
FIG. 3B illustrates an end effector moving a substrate process kit and a substrate process kit carrier to a station of a manufacturing system, according to aspects of the present disclosure.
Figure 3A:
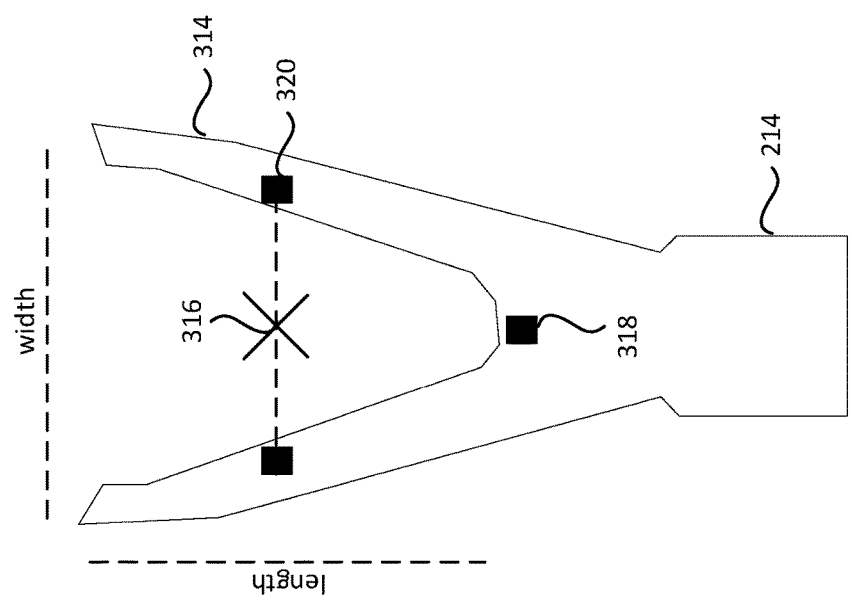
FIG. 3A illustrates an end effector of a robot arm, according to aspects of the present disclosure.

FIGS. 3A and 3B illustrate an end effector 214 of a robot arm 212, according to aspects of the present disclosure. In some embodiments, end effector 214 can include two or more blades 314. Each blade 314 can be configured to interact with a portion of an object (e.g., a substrate, a process kit 310, a process kit carrier 312, etc.). In an illustrative example, robot arm 212 can move end effector 214 under a process kit 310 at a first station of manufacturing system 100 such that each blade 314 is placed underneath process kit 310 and can move end effector 214 towards process kit 310 to engage blade(s) 314 with process kit 310. In other or similar embodiments, process kit 310 can be placed on carrier 312, in accordance as illustrated in FIG. 3B. Robot arm 212 can move end effector 214 under process kit 310 and carrier 312 so that each blade 314 is placed underneath process kit 310 and carrier 312 and can move end effector 214 towards process kit 310 and carrier 312 to engage blade(s) 314 with process kit 310 and/or carrier 312. In some embodiments, carrier 312 can include one or more components (e.g., pins) configured to engage with one or more receptacles of each blade 314 of end effector 214. In other or similar embodiments, carrier 312 can include one or more receptacles configured to engage with one or more components (e.g., pins) of each blade 314 of end effector 214.

In some embodiments, robot arm 212 can engage each blade 314 of end effector 214 with process kit 310 and/or carrier 312 so that process kit 310 and/or carrier 312 is disposed at a target placement on end effector 214. Process kit 310 and/or carrier 312 can be disposed at a target placement on end effector 214 when a particular portion of process kit 310 and/or carrier 312 corresponds with (e.g., is positioned approximately on top of or beneath) a particular portion of end effector 214. For example, process kit 310 can be disposed at a target placement on end effector 214 when a center 322 of process kit 310 and/or carrier 312 corresponds with a center 316 of end effector 214. In some embodiments, the center 316 of end effector 214 can be identified by a particular reference feature, such as reference feature 318, included on a portion of end effector 214. In other or similar embodiments, the center 316 of end effector 214 can be identified as a particular location relative to a particular reference feature, such as reference feature(s) 320, or a particular reference location identified at a portion of end effector 214. For example, a center 316 of end effector 214 can be located between blades 314 of end effector 214. In some embodiments, system controller 128 can identify the center 316 of end effector 214 based on a length of each blade 314 and a width between each blade 314 of end effector 214. In other or similar embodiments, system controller 128 can identify the center 316 of end effector 214 based on a distance between reference features 320.

It should be noted that although embodiments of the present disclosure are directed to a target placement of a process kit 310 and/or carrier 312 in view of a center 316 of end effector 214, a target placement of process kit 310 and/or carrier 312 can be determined in view of any portion of end effector 214 (e.g., an end of one or more blades 314, a wrist of end effector 214, etc.). For example, in some embodiments, end effector 214 does not include blades 314 and can include other or additional components to support a process kit 310 and/or carrier 312. The target placement of process kit 310 and/or carrier 312 can be determined in view of the other or additional components of end effector 214.

System controller 128 can associate an identified center 316 of end effector 214 with a particular coordinate (e.g., a Cartesian coordinate, etc.). For purposes of the present disclosure, system controller 128 can associate an identified center 316 of end effector 214 with coordinate (0,0). However, it should be noted that system controller 128 can associate an identified center 316 or other portion of end effector 214 with any coordinate. System controller 128 can identify a center 322 of process kit 310 and/or carrier 312 disposed on end effector 214, and can determine a correspondence between the center 316 of end effector 214 and the center of process kit 310 and/or carrier 312, in accordance with embodiments described herein.

As discussed above, robot arm 212 can cause end effector 214 to engage with process kit 310 and/or carrier 312 and can move end effector 214 and process kit 310 and/or carrier 312 from the first station to a second station of manufacturing system 100. Robot arm 212 can position process kit 310 at or near a target location at the second station. In some embodiments, robot arm 212 can position process kit 310 and/or carrier 312 at the target location in view of the determined correspondence between the center 316 of end effector 214 and the center of process kit and/or carrier 312, in accordance with embodiments described herein. In some embodiments, the second station can be a process chamber 114, 116, 118, and robot arm 212 can position process kit 310 and/or carrier 312 near or at a substrate support assembly of the process chamber 114, 116, 118. The substrate support assembly can include one or more components (e.g., lift pins) configured to receive process kit 310 at a surface of substrate support assembly. Robot arm 212 can cause end effector 214 to place process kit 310 and/or carrier 312 on the one or more components of the substrate support assembly. In response to robot arm 212 placing process kit 310 and/or carrier 312 on the one or more components of substrate support assembly, robot arm 212 can cause end effector 214 to disengage with process kit 310 and move end effector 214 out of the process chamber 114, 116, 118. The one or more components of the substrate support assembly can cause the process kit 310 to be placed at a target location directly on the surface of the substrate support assembly and a process can be subsequently performed at process chamber 114, 116, 118.

In some embodiments, robot arm 212 and/or end effector 214 can include a direction encoder (referred to as an encoder) to determine a particular position of end effector 214 within manufacturing system 100.

Referring back to FIGS. 2A-2B, lid 206 of transfer chamber 110 can include a window 216 disposed proximate to port 210 (e.g., the entrance of process chamber 114, 116, 118). A sensor 218 can be disposed on or near window 216 so that sensor 218 can view a portion of end effector 214 and process kit 310 and/or carrier 312 as the process kit 310 and/or carrier 312 passes through port 210. Window 216 can be fabricated of quartz or other material that does not substantially interfere with the detection mechanism of sensor 218. In some embodiments, one or more elements of sensor 218 can be disposed on the exterior of window 216 to isolate sensor 218 from the environment of transfer chamber 110.

In some embodiments, sensor 218 can be a thru-beam sensor. For example, sensor 218 can include an first element 219A and a second element 219B. In some embodiments, the first element 219A can be an emitting element configured to emit a signal 220 (e.g., a light beam) through window 216 towards second element 219B disposed at the bottom 202 of transfer chamber 110. In such embodiments, second element 219B can be a receiving element configured to receive signal 220 emitted by first element 219A. Sensor 218 can determine that no object (e.g., end effector 214, a substrate 102, process kit 310, carrier 312, etc.) is placed at or near port 210 as long as signal 220 is received at second element 219B. As illustrated in FIG. 2A, neither end effector 214 nor process kit 310 and/or carrier 312 is placed at or near port 210. As such, signal 220 emitted by first element 219A is received at second element 219B. As illustrated in FIG. 2B, robot arm 212 has moved end effector 214 carrying process kit 310 and/or carrier 312 near port 210. As a result, process kit 310 and/or carrier 312 blocks signal 220 emitted by first element 219A from being received by second element 219B. As such, sensor 218 can detect that an object (e.g., end effector 214, process kit 310, and/or carrier 312) is placed at or near port 210.

In other or similar embodiments, sensor 218 can be a reflective sensor. For example, first element 219A can be configured to emit signal 220, as previously described, and second element 219B can be configured to reflect signal 220 back to first element 219A. In such embodiments, first element 219A can be further configured to determine whether an object is placed at or near port 210 by determining whether signal 220 emitted from first element 219A is reflected by second element 219B back to first element 219A. As illustrated in FIG. 2A, neither end effector 214 nor process kit 310 and/or carrier 312 is placed at or near port 210. As such, signal 220 emitted by first element 219A is reflected by second element 219B back to first element 219A. As illustrated in FIG. 2B, robot arm 212 has moved end effector 214 carrying process kit 310 and/or carrier 312 near port 210. Process kit 310 and/or carrier 312 blocks signal 220 from being reflected by second element 219B back to first element 219A. As such, sensor 218 can detect that an object (e.g., end effector 214, process kit 310, and/or 312 carrier) is placed at or near port 210.

In other or similar embodiments, sensor 218 can be any sensor configured to detect whether an object is placed at or near port 210. For example, sensor 218 can be an optical sensor, a proximity sensor, a mechanical light switch, a Hall-effect sensor, reed switches, or another type of detection mechanism suitable for detecting an object placed at or near port 210.

As discussed previously, FIG. 3B illustrates an end effector moving a process kit 310 and/or a carrier 312 to a station 330 of a manufacturing system, according to aspects of the present disclosure. In some embodiments, station 330 can be a processing chamber, such as processing chamber 114, 116, 118 of FIG. 1. In other or similar embodiments, station 330 an be any station described with respect to FIG. 1 or any other station that is included in a manufacturing system. One or more sensors, such as sensors 218 of FIGS. 2A-2B, can be disposed at or near an entrance 332 (e.g., a port 210) to the station, in accordance with previously described embodiments. Each of the one or more sensors 218 can be configured to generate a signal corresponding to a different portion of an object moved into and out of the station 330. For example, a first sensor 218A can generate a first signal for a first portion of process kit 310 and/or carrier 312, a second sensor 218B can generate a second signal for a second portion of process kit 310 and/or carrier 312, and a third sensor 218B can generate a third signal for a third portion of process kit 310 and/or carrier 312. As end effector 214 moves process kit 310 and/or carrier 312 towards or away from entrance 332, one or more portions of process kit 310 and/or carrier 312 can trigger a sensor (i.e., cause a signal of sensor 218 to be blocked). As end effector 214 continues to move process kit 310 and/or carrier 312 towards or away from entrance, the one or more portions of process kit 310 and/or carrier 312 that blocked the signal 220 generated by sensor 218 can now unblock the signal (i.e., the signal is received by emitting element 219A and/or receiving element 219B). Each sensor 218 can generate data associated with a respective signal, the data indicating an instance in time a portion of process kit 310 and/or carrier 312 blocks or unblocks signal 220 as end effector 214 moves process kit 310 and/or carrier 312 towards or away from entrance 332. Further details regarding signals generated by sensors 218 are provided herein.

Figure 5:
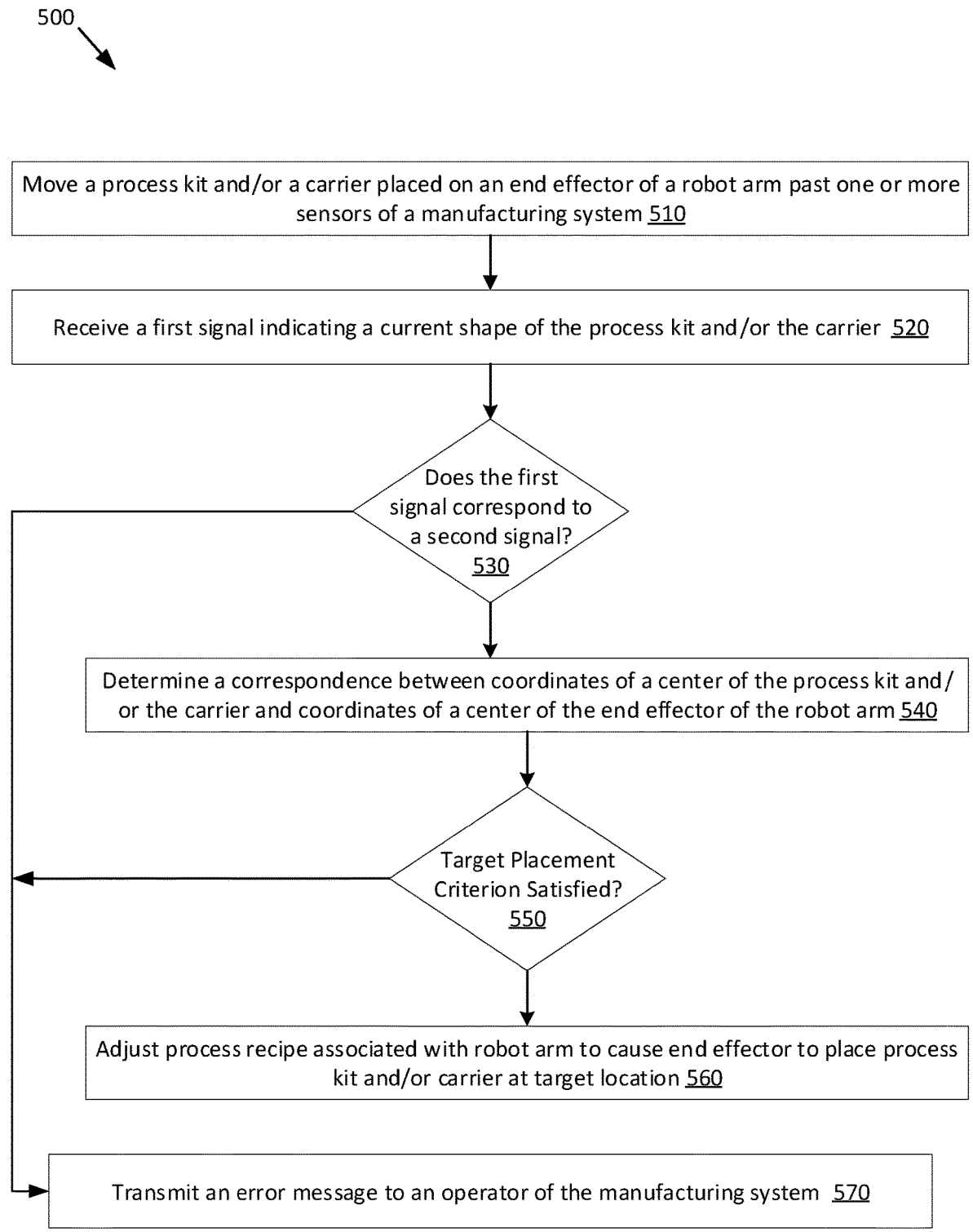
FIG. 5 is a flow chart of a method for determining a correspondence between a center of a process kit and/or a process kit carrier and a center of an end effector, according to aspects of the present disclosure.

FIG. 4 is a flow chart of a method 400 for obtaining a signal indicating a shape of a process kit and/or a carrier, according to aspects of the present disclosure. FIG. 5 is a flow chart of a method 500 for determining a correspondence between a center of a process kit and/or a carrier and a center of an end effector, according to aspects of the present disclosure. Methods 400 and 500 can be performed by processing logic that can include hardware (circuitry, dedicated logic, etc.), software (such as is run on a general purpose computer system or a dedicated machine), firmware, or some combination thereof. Some operations of methods 400 and 500 can be performed by a processing device, such as system controller 128 of FIG. 1.

For simplicity of explanation, methods 400 and 500 are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events.

Referring now to FIG. 4, at block 410, a process kit and/or a carrier is placed at a target location of an end effector of a robot arm. In some embodiments, the process kit can be a calibration process kit and/or the carrier can be a calibration carrier. A calibration process kit and/or carrier can be specially designed for collecting data associated with signals of sensors 218, where the data indicates a shape of a process kit and/or carrier placed on end effector 214. For example, the calibration process kit and/or carrier can include particular features (e.g., registration features, pins or other components to engage with the end effector, etc.) that enable the calibration process kit and/or carrier to be displaced at a target location of an end effector.

In other or similar embodiments, the process kit can be process kit 310 and the carrier can be carrier 312 illustrated in FIG. 3B. In such embodiments, one or more measurements can be performed to identify a center 322 of process kit 310 and/or carrier 312. In response to identifying a center 322 of process kit 310 and/or carrier 312, process kit 310 and/or carrier 312 can be disposed at a target placement of end effector 214. As described previously, process kit 310 and/or carrier 312 can be disposed at a target placement of end effector 214 when the center 322 of process kit 310 and/or carrier 312 corresponds with a center 316 of end effector 214. In some embodiments, center 322 corresponds with center 316 if center 322 approximately aligns with (i.e., is directly above or below) center 316 as process kit and/or carrier 312 is disposed on end effector 214. In other or similar embodiments 322, center 322 corresponds with center 316 if center 322 is located within a particular distance from center 316 as process kit 310 and/or carrier 312 is disposed on end effector 214.

In some embodiments, an operator of the manufacturing system can place process kit 310 and/or carrier 312 at the target placement of end effector 214. In other or similar embodiments, one or more automated components of the manufacturing system (e.g., transfer chamber robot 110) can engage with process kit 310 and/or carrier 312 so that process kit 310 and/or carrier 312 is disposed at the target placement of end effector 214 in accordance with previously described embodiments. Although embodiments of the present disclosure are directed to process kit 310 and/or carrier 312 placed at the target location of end effector 214, it should be noted that the calibration process kit and/or calibration carrier can be placed at the target location of end effector 214, in accordance with previously described embodiments.

Figure 7B:
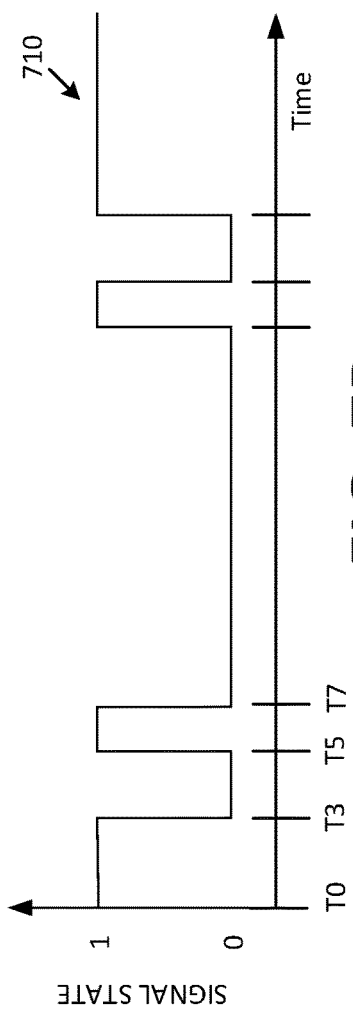
FIGS. 7B-7D illustrate signals generated by sensors at an entrance of a station of the manufacturing system, according to aspects of the present disclosure.
Figure 7C:
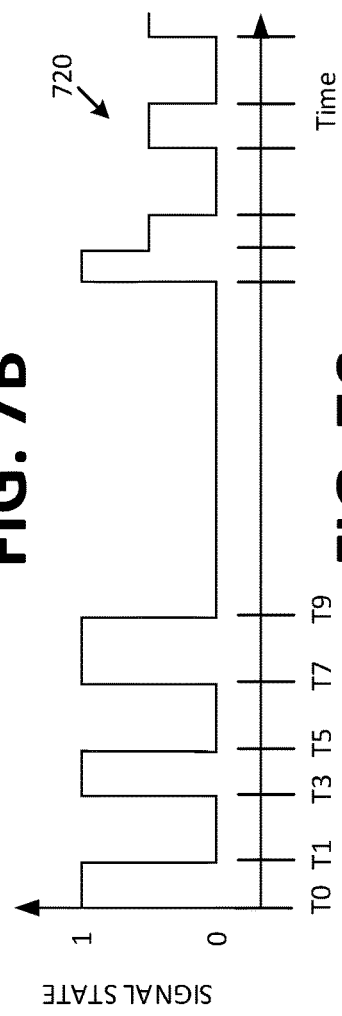
Figure 7D:
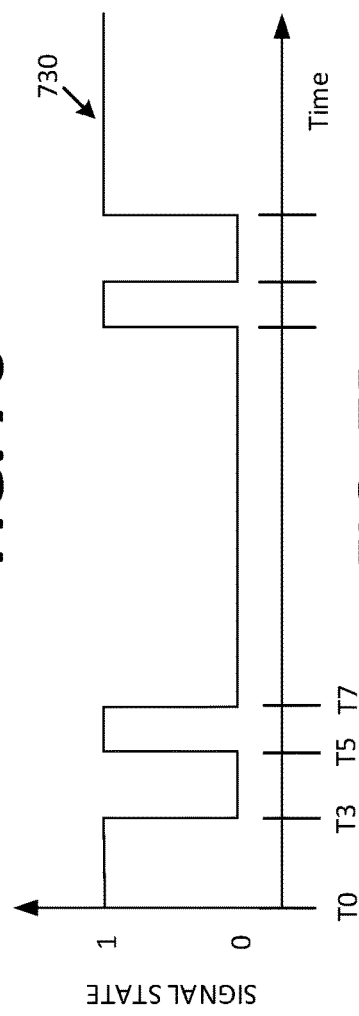
Figure 7A:
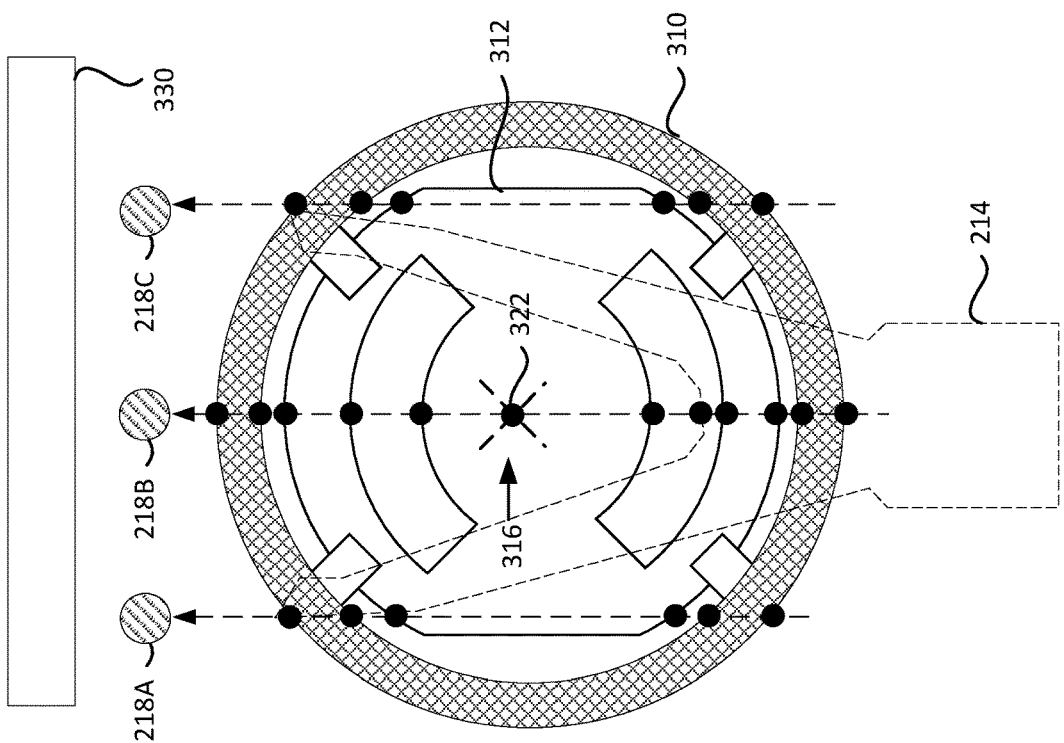
FIG. 7A illustrates sensors of a manufacturing system detecting a process kit and a carrier at a target placement on an end effector, according to aspects of the present disclosure.

FIG. 6A illustrates a process kit 310 disposed at a target placement of end effector 214. As illustrated in FIG. 6A, the center 322 of process kit 310 corresponds (i.e., approximately aligns) with the center 316 of end effector 214. FIG. 7A illustrates a process kit carrier 312 disposed at a target placement of end effector 214. As illustrated in FIG. 7A, the center 322 of carrier 312 corresponds with the center 316 of end effector 214.

Referring back to FIG. 4, at block 420, the processing device moves the process kit 310 and/or the process kit carrier 312 near a set of sensors at the manufacturing system. In some embodiments, the set of sensors can include sensors 218A, B, and/or C, as described with respect to FIG. 3B. As illustrated in FIG. 6A, the robot arm 212 moves end effector 214 and process kit 310 towards station 330 of the manufacturing system. As described previously, a first element 219A of a respective sensor can transmit a signal 220 to a second element 219B. If no object is placed between the first element 219A and second element 219B, the second element 219B can receive the signal 220 from first element 219A and/or reflect the signal 220 back to first element 219A (i.e., the signal transmitted between first element 219A and second element 219B is not blocked, or "unblocked"). In response to detecting the signal 220 was received or reflected by second element 219A, a respective sensor can detect that no object is placed between the first element 219A and the second element 219A. The detection that no object is placed between the first element 219A and second element 219B of a respective sensor is referred to as a first state of signal 220. In response to detecting the signal 220 was not received or reflected by second element 219B, the respective sensor can detect that an object is placed between the first element 219A and the second element 219B (i.e., the signal 220 is blocked between the first element 219A and second element 219B). The detection of an object is placed between the first element 219A and second element 219B of the respective sensor is referred to as a second state of signal 220. A respective sensor 218 can detect a change in the state of the signal 220 as an object passes between first element 219A and second element 219B. In response to detecting a change in the state of the signal 220, the respective sensor 218 can transmit an indication to a computing system for the manufacturing system, such as system controller 128. System controller 128 can track the change in the state of the signal for a respective sensor 218 over time.

FIGS. 6B-6D depict graphs 610-630 that illustrate the change in state of each signal 220 transmitted by first elements 219A of each sensor 218A, B, and C as the robot arm 212 moves end effector 214 and process kit 310 towards station 330. In some embodiments, the state of each signal 220 can be the state received by system controller 128 from each sensor 2181, B, C, in accordance with embodiments described above.

FIG. 6B depicts a graph 610 that illustrates the change in the state of a signal 612 transmitted by first element 219A of sensor 218A as end effector 214 and process kit 310 moves towards station 330. During a first time interval (i.e., T0-T3), neither end effector 214 nor process kit 310 are placed between first element 219A and second element 219B of sensor 218A (i.e., the signal transmitted by the first element 219A of sensor 218A is "unblocked"). Sensor 218A can transmit a notification to system controller indicating that sensor 218A is unblocked. As seen in FIG. 6B, signal 612 is associated with a first state (e.g., a value of 1) during the first time interval. At time T3, an edge 614 of process kit 310 is moved between first element 219A and second element 219B of sensor 218A. As a result, the signal transmitted by the first element 219A of sensor 218A is blocked. Sensor 218A can detect this change in the state of the signal 612 and transmit a notification to system controller 128 indicating that sensor 218A is blocked at time T3. As seen in FIG. 6B, signal 612 is associated with a second state (e.g., a value of 0) at time T3. The signal of sensor 218A can continue to be blocked until time T5. It should be noted that, although embodiments of the present disclosure associate the first state of a signal with a value of 1 and the second state of the signal with a value of 0, various states of a signal can be associated with any value. At time T5, another edge of process kit 310 passes between sensor 218A, causing the signal of sensor 218A to be unblocked. Sensor 218A can detect this change in the state of the signal 612 and transmit a notification to system controller 128 indicating that sensor 218A is unblocked at time T5. As seen in FIG. 6B, signal 612 is associated with the first state at time T5.

Sensor 218A can detect the change in the state of signal 612 as end effector 214 and process kit 310 are moved into station 330. Graph 610 illustrates the resulting shape of signal 612 after the process kit 310 is moved into station 330. In some embodiments, the resulting shape of signal 612 can correspond to a shape of the process kit 310 placed on end effector 214. For example, the change of the signal state at time T3 can correspond to an outer diameter of the process kit and the change of the signal state at time T5 can correspond to an inner diameter of the process kit. As illustrated in FIG. 6B, another change of the signal state is detected at time T11 and at time T13. The change of the signal state at time T11 can correspond to the inner diameter of the process kit and the change of the signal state at time T13 can correspond to the outer diameter of the process kit.

FIGS. 6C and 6D depict graphs 620 and 630 that illustrate the change in the state of signals 622 and 632 transmitted by first element 219A of sensors 218B and 218C, respectively, as end effector 214 and process kit 310 move towards station 330, in accordance with previously described embodiments. Each graph 620 and 630 illustrate the resulting shape of signals 622 and 632 after the process kit 310 is moved into station 330, where each resulting shape of signals 622 and 632 correspond to a shape of the process kit 310 placed on end effector 214, as previously described.

In some embodiments, end effector 214, or other components of robot arm 212, can be placed between first element 219A and second element 219B of a respective sensor 218. For example, as illustrated in FIGS. 6A and 6C, between time T2 and T10, no portion of process kit 310 or end effector 214 blocks the signal 622 of sensor 218B. At time T10, an edge 624 of end effector 214 is blocks signal 622 of sensor 218B. In some embodiments, end effector 214 can completely block signal 622. In such embodiments, sensor 218B can detect that the state of signal 622 has changed from unblocked to blocked and transmit a notification to system controller 128, in accordance with previously described embodiments. In other or similar embodiments, end effector 214 can partially block signal 622. An object can partially block a signal when a strength or intensity of a signal transmitted from first element 219A is greater than the strength or intensity of the signal when it is received by the second element 219A. In some embodiments, this can occur if an object is composed of a material that blocks a portion of the signal from being transmitted to the second element 219A but allows another portion of the signal to be transmitted to the second element 219A. Sensor 218B can determine that signal 622 is partially blocked. As seen in FIG. 6C, signal 622 is associated with a third state (e.g., a value between 1 and 0) at time T15. End effector 214 can partially block signal 622 until time T16. At time T16, an edge 626 of process kit 310 is moved between first element 219A and second element 219B of sensor 218B. Sensor 218B can detect a change in the state of signal 622 and can transmit a notification to system controller 128 indicating that sensor 218B is blocked at time T16. As seen in FIG. 6C, signal 622 is associated with the second state at time T13. At time T16 another edge 628 of process kit 310 is moved between first element 219A and second element 219B of sensor 218B. As seen in FIG. 6A, at time T14, signal 622 is no longer blocked by process kit 310 but is blocked by end effector 214. As such, sensor 18B can detect a change in the state of signal 622 and can transmit a notification to system controller 128 indicating that sensor 218B is partially blocked at time T16.

Sensors 218A-C can detect a change in the state of signals in response to a process kit carrier 312 (with or without a process kit), in accordance with previously described embodiments. FIGS. 7B-7D depict graphs 710-730 that illustrate the change in state of each signal 712, 722, 732 transmitted by first elements 219A of each sensor 218A-C as the robot arm 212 moves end effector 214, process kit 310 and carrier 312 towards station 330. The resulting shape of each signal 712, 722, and 732 can correspond to a shape of process kit 310 and process kit carrier 312 placed on end effector 214, in accordance with previously described embodiments.

At block 430, the processing device (i.e., system controller 128) receives a signal indicating a shape of the process kit 310 and/or the carrier 312. As described previously, each sensor 218A-C can transmit a message to system controller 128 for each change of a state of a signal (e.g., signals 612, 622, 632, 712, 722, 732, etc.). System controller 128 can receive each message and determine a time of each change of the state of each signal. System controller 128 can track the change in the state of each signal over time, as illustrated in FIGS. 6B-6D and 7B-7D. As discussed previously, the change in the state of each signal over time can correspond to a current shape of the process kit and/or carrier 312 placed at end effector 214. As such, system controller 128 can associate a particular shape of each signal, as illustrated in FIGS. 6B-6D and 7B-7D with the current shape of the process kit and/or carrier 312. As discussed previously, the process kit 310 and/or carrier 312 are disposed at a target placement at end effector 214. As such, the shape of each signal corresponds with a target shape for the process kit 310 and/or carrier 312.

At block 440, the processing device (e.g., system controller 128) stores the signal indicating the shape of the process kit 310 and/or carrier 312 at a data store, such as data store 130 of FIG. 1. In some embodiments, system controller 128 can store data received from each sensor 218A-C used to determine the shape of each signal. For example, system controller 128 can store data indicating a change in the state of a particular signal (e.g., a change from value 1 to value 0) and a timestamp indicating an instance in time the change occurred. In some embodiments, system controller 128 can store additional data associated with the signal. For example, system controller 128 can store data associated with an intensity of the signal. The system controller 128 can also store data associated with the process kit 310 and/or carrier 312 that is associated with each particular signal. For example, the system controller 128 can store data indicating a type of material used to compose one or more portions of the process kit and/or carrier 312.

As described previously, FIG. 5 is a flow chart of a method 500 for determining a correspondence between a center 322 of a process kit 310 and/or a carrier 312 and a center 316 of an end effector 214. At block 510, a process kit 310 and/or a carrier 312 is moved past two or more sensors of a manufacturing system. The process kit 310 and/or carrier 312 can be placed on an end effector (e.g., of a robot arm or a rotating carousel). For example, transfer chamber robot 112 or factory interface robot 126 can move process kit 310 and/or carrier 312 past the two or more sensors, in accordance with previously described embodiments. In another example, an end effector of a rotating carousel within a process chamber can move process kit 310 and/or carrier 312 past the two or more sensors. FIG. 8A illustrates a process kit 310 placed on an end effector 214 of a robot arm, in accordance with previously described embodiments. Although embodiments below are described with respect to determining a correspondence between a center 322 of a process kit 310 and a center 316 of an end effector 214, the same or similar embodiments can be applied to determine a correspondence between a center of a carrier 312 (with or without a process kit 310) and a center 316 of the end effector 214.

In some embodiments, the two of more sensors can be any of sensors 218A-C depicted in FIGS. 2A-B and 3B. As described previously, one or more sensors 218A-C can include a first element 219A (i.e., a signal emitting element) and a second element 219B (i.e., a signal receiving element). A sensor can detect the process kit 310 and/or the carrier 312 in response to the robot arm 212 moving the process kit 310 and/or the carrier 312 between the first element 219A and the second element 219B of the sensor by detecting a change in a state of the signal transmitted by the first element 219A of the sensor, in accordance with previously described embodiments. FIGS. 8A-8B depict graphs 810-830 that illustrate the change in the state of signals 812, 822, and 832 transmitted by first element 219A of sensors 218A-C, respectively, as end effector 214 and process kit 310 move toward station 330, in accordance with previously described embodiments. Each graph 810, 820, and 830 illustrate the resulting shape of signals 812, 822, and 832 after process kit 310 is moved into station 330, where each resulting shape of signals 812, 822, and 832 correspond to a shape of process kit 310 placed on end effector 214.

At block 520, the processing device receives a first signal indicating a current shape of the process kit 310 and/or the carrier 312. As described previously, each sensor 218A-C can transmit a message to system controller 128 for each change of a state of a signal (e.g., signals 812, 822, 832, etc.). System controller 128 can receive each message and determine a time of each change of the state of each signal. System controller can track the change in the state of each signal over time, as illustrated in graphs 810, 820, and 830 of FIGS. 8B-8D.

At block 530, the processing device determines whether the first signal corresponds to a second signal indicating a predefined shape of a process kit and/or process kit carrier. As described previously, system controller 128 can receive signals indicating a shape of a process kit and/or a carrier disposed at a target position of end effector 214. System controller 128 can store data corresponding to the shape of the process kit and/or carrier at the target position of end effector 214 at data store 130. System controller 128 can identify data, from data store 130, for the second signal that indicates the predefined shape of a process kit. In response to receiving the first signal indicating the current shape of process kit 310 and/or carrier 312, system controller 128 can compare data for the first signal to the data for the second signal to determine whether a current shape of process kit 310 corresponds to the predefined shape of a process kit.

In an illustrative example, system controller 128 can reference data store 130 and identify data associated with signal 612. System controller 128 can compare the data obtained for signal 812 to the data associated with signal 612 to determine whether a difference between signal 612 and 812 satisfies a difference criterion. As described previously, the resulting shape of signal 612 after a process kit disposed at a target placement of end effector 214 can correspond to a shape of the process kit placed on end effector 214. The change of the signal at times T3 and T13 can correspond to an outer diameter of the process kit and the change of the signal state at times T5 and T11 can correspond to an inner diameter. System controller 128 can determine based on signal 812, each instance that a state of the signal of sensor 218A changed between state 1 and state 0. For example, system controller 128 can determine that the state of the signal of sensor 218A changed from state 1 to state 0 at time T2, changed from state 0 to state 1 at time T4, changed from state 1 to state 0 at time T10, and changed from state 0 to state 1 at time T12. System controller can determine that the change of the signal state at times T2 and T12 correspond to an outer diameter of an object and the change of the signal state at times T4 and T12 correspond to an inner diameter of an object.

System controller can compare the shape of signal 812 to the shape of signal 612 to determine whether the current shape of process kit 310 corresponds to a target shape of a process kit, indicated in signal 812. In some embodiments, system controller 128 can determine that the current shape of process kit 310 corresponds to the target shape of the process kit by determining whether a number of signal state changes included in signal 812 correspond to a number of signal state changes included in signal 612 (i.e., whether the number of edges detected for process kit 310 correspond to the number of edges for a target process kit). The number of signal state changes included in signal 812 can correspond to the number of signal state changes included in signal 612 if a difference between the number of signal state changes included in respective signals satisfies a difference threshold value. For example, a difference threshold value can be 1. As signal 612 and 812 each include four signal state changes, a difference between the number of signal state changes included in each respective signal satisfies the difference threshold value. In another embodiment, system controller 128 can determine that the current shape of process kit 310 corresponds to the target shape of a process kit by determining whether the state changes of signal 812 occur within a threshold time interval as the state changes of signal 612. For example, system controller 128 can determine that a set of state changes of signal 812 include state changes at time T2 and T4 and another set of state changes of signal 612 include state changes at time T3 and T5. A threshold time interval can be a value of 2 (e.g., 2 seconds). System controller can determine that a difference between a first state change of the set of state changes of signal 812 (e.g., the state change at time T1) and a second state change of the set of state changes of signal 612 (e.g., the state change at time 2) satisfies the threshold time interval. In some embodiments, system controller 128 can compare each set of state changes of signal 812 to corresponding state changes of the set of state changes of signal 612 and determine whether the difference between each state changes satisfies the threshold time interval. In response to determining the difference between each state change of signals 812 and 612 satisfies the threshold time interval, system controller 128 can determine the current shape of process kit 310 corresponds to a target shape of a process kit.

In another illustrative example, system controller 128 can reference data store 130 and identify data associated with signal 712. System controller can compare the data associated with signal 812 to the data associated with signal 712 to determine whether a shape of signal 812 corresponds to the shape of signal 712, in accordance with previously described embodiments. For example, system controller 128 can determine that the number of signal state changes included in signal 812 (i.e., four state changes) does not correspond to the number of signal state changes included in signal 712 (i.e., six state changes). System controller 128 can also determine that the state changes of 812 do not occur within a threshold time interval as the state changes of signal 712, in accordance with previously described embodiments. As such, system controller 128 can determine that the current shape of the signal for the object (e.g., process kit 310) does not correspond to the shape of the signal for a process kit.

In some embodiments, system controller 128 can determine (i.e., based on a process recipe) that an object placed on end effector is expected to be a process kit 310. In such embodiments, system controller 128 can identify particular data stored at data store 130 corresponding to a predefined shape for a process kit. System controller 128 can determine whether the current shape of the object corresponds to the predefined shape of the process kit, in accordance with previously described embodiments.

Referring back to FIG. 5, in response to determining the first signal does not correspond to the second signal indicating the predefined shape for the process kit and/or carrier, the processing device can determine that the current shape of process kit 310 does not correspond to the predefined shape for the a process kit. In such instances, method 500 can proceed to block 570. At block 570, the processing device can transmit an error message to an operator of the manufacturing system. In some embodiments, the error message can indicate that the current shape of the process kit 310 does not correspond to the predefined shape for the process kit and/or carrier.

In response to determining each of the first set of signals correspond to the respective signal of the second set of signals, the processing device can determine that the current shape of the process kit corresponds to the predefined shape for the process kit and/or process kit carrier. In such instances, method 500 can proceed to block 540. At block 540, the processing device can determine a correspondence between a center 322 of the process kit 310 and a center 316 of the end effector 214. The correspondence can refer to a difference between a current placement of process kit 310 on the end effector 214 and a target placement of a process kit on the end effector. As described previously, a process kit (and/or carrier) is disposed at a target placement on an end effector 214 if a center of the process kit corresponds (e.g., approximately aligns) with a center 316 of end effector 214. The center 316 of end effector 214 can be determined in accordance with previously described embodiments. As described previously, system controller 128 can associate an identified center 316 of end effector 214 with a particular coordinate (e.g., a Cartesian coordinate, etc.), such as coordinate (0,0).

System controller 128 can determine a center 322 of process kit 310 based on monitored shape of signals 812, 822, 832 as process kit 310 is moved towards or away from station 310. As described previously, each change in a signal state detected by a sensor 218 indicates an edge of process kit 310. System controller 128 can associate each signal state change included in signals 812, 822, 832 with an edge of process kit 310 and can associate each edge with a particular portion of process kit 310. For example, system controller 128 can associate a first state change of each signal 812, 822, 832 with an outer diameter of process kit 310. In another example, system controller 128 can associate a second state change of each signal 812, 822, 832 with an inner diameter of process kit 310.

In some embodiments, system controller 128 can determine whether a particular state change corresponds to an edge of process kit 310 or corresponds to another object placed between a first element 219A and a second element 219B of a particular sensor 218. For example, as illustrated in FIGS. 8A and 8D, sensor 218C can detect that a portion of an object (e.g., a blade of end effector 214) is placed first element 219A and second element 219B of sensor 218C at time T3. System controller 128 can determine whether the amount of time that the object blocks the first element 219A and second element 219B of sensor 218C corresponds to an amount of time that a portion of a process kit is expected to block sensor 218C. For example, system controller 128 can determine (e.g., based on signals 612, 622, 632) that a portion of a process kit blocks the emitting element for approximately 2 seconds. System controller 128 can determine sensor 218C was blocked, beginning at time T3, for approximately 0.5 sections. As such, system controller 128 can determine that the object (i.e., the blade of end effector 214) blocking sensor 218C at time T3 does not correspond to a process kit. In such embodiments, system controller 128 can evaluate signal 832 to identify a subsequent instance that an object blocked sensor 218 for the expected interval. In response to identifying the subsequent instance, system controller 128 can determine that a first instance in time of the identified time interval corresponds to a detection of an edge of process kit 310 and associate the corresponding edge with a particular portion of process kit 310. As illustrated in FIG. 8D, system controller 128 can identify the interval of time between time T4 and T6 that corresponds to an edge of a process kit. System controller 128 can therefore determine that time T4 is a first state change of signal 832 and associate the state change at time TX with an edge at an outer diameter of process kit 310.

In response to associating each edge with a particular portion of process kit 310, the system controller 128 can perform a centerfind algorithm to determine a center of process kit 310. System controller 128 can assign each associated edge to a particular coordinate relative to the center 316 of end effector 214. System controller 128 can then identify a set of edges that are co-circular with other edges detected by sensors 218. For example, system controller 128 can determine that the edges associated with state changes at time T2 at signal 812, T1 at signal 822, and time T4 at signal 832 are co-circular edges because a geometry of each respective edge corresponds to a circular shape. System controller 128 can group each edge of the set of edges in groups of three coordinates to define both a triangle and a circle.

In response to defining a triangle and a circle of each group of the set of edges, system controller 128 can calculate the center and the radius of the defined circle based on a distance between each of a group of particular edges. In some embodiments, system controller 128 can determine a distance between each of a group of particular edges based on a distance between each sensor at the entrance of station 330. In other or similar embodiments, system controller 128 can determine the distance between each of the group of particular edges based on a speed that end effector 214 moves towards station 330 and an amount of time between each signal state change detected by sensors 218. System controller 128 can calculate the center and the radius of each defined circle for each group of the set of edges and determine a center and radius that corresponds to the center of process kit 310. For example, system controller 128 can determine the center and radius of process kit 310 based on an average center and radius for each group of the set of edges. In response to determining the center and radius of process kit 310, system controller 128 can assign a coordinate to the determined center relative to the center of end effector 214. For example, system controller can determine the location of the center 322 of process kit 310 and assign center 322 a coordinate of (0,1).

Referring back to FIG. 5, at block 540, the processing device can determine a correspondence between coordinates of the center of the process kit 310 and coordinates of the center of end effector 214. System controller 128 can determine a correspondence between the center 322 of process kit 310 and the center of end effector 214 based on a distance between the coordinate corresponding to center 316 and center 322. For example, system controller 128 can determine a difference between center 322 and center 316 is (0, +1). As such, the correspondence between center 316 and center 322 is (0, +1).

At block 550, the processing device can determine whether the determined correspondence satisfies a target placement criterion. System controller 128 can determine the determined correspondence satisfies a target placement criterion based on a determination that a difference between center 322 and center 316 does not exceed a threshold difference value. In response to determining the correspondence satisfies a target placement criterion, method 500 can continue to block 560. In response to determining the correspondence does not satisfy the target placement criterion, method 500 can continue to block 570.

At block 560, the processing device can adjust a process recipe associated with a robot arm to cause the end effector to place the process kit 310 at a target location at the station of manufacturing system 100. System controller 128 can modify a process recipe associated with robot arm 212 to cause end effector 214 to place process kit 310 at a target location at station 330. For example, system controller 128 can determine, based on the determined correspondence between center 322 and center 316, that process kit 310 is placed slightly to the right of the target placement on end effector 214. As such, system controller 128 can adjust the process recipe associated with robot arm to place process kit 310 at a location that is slightly to the left of the target location at station 330 to account for the placement of process kit 310 on end effector 214.

Figure 9:
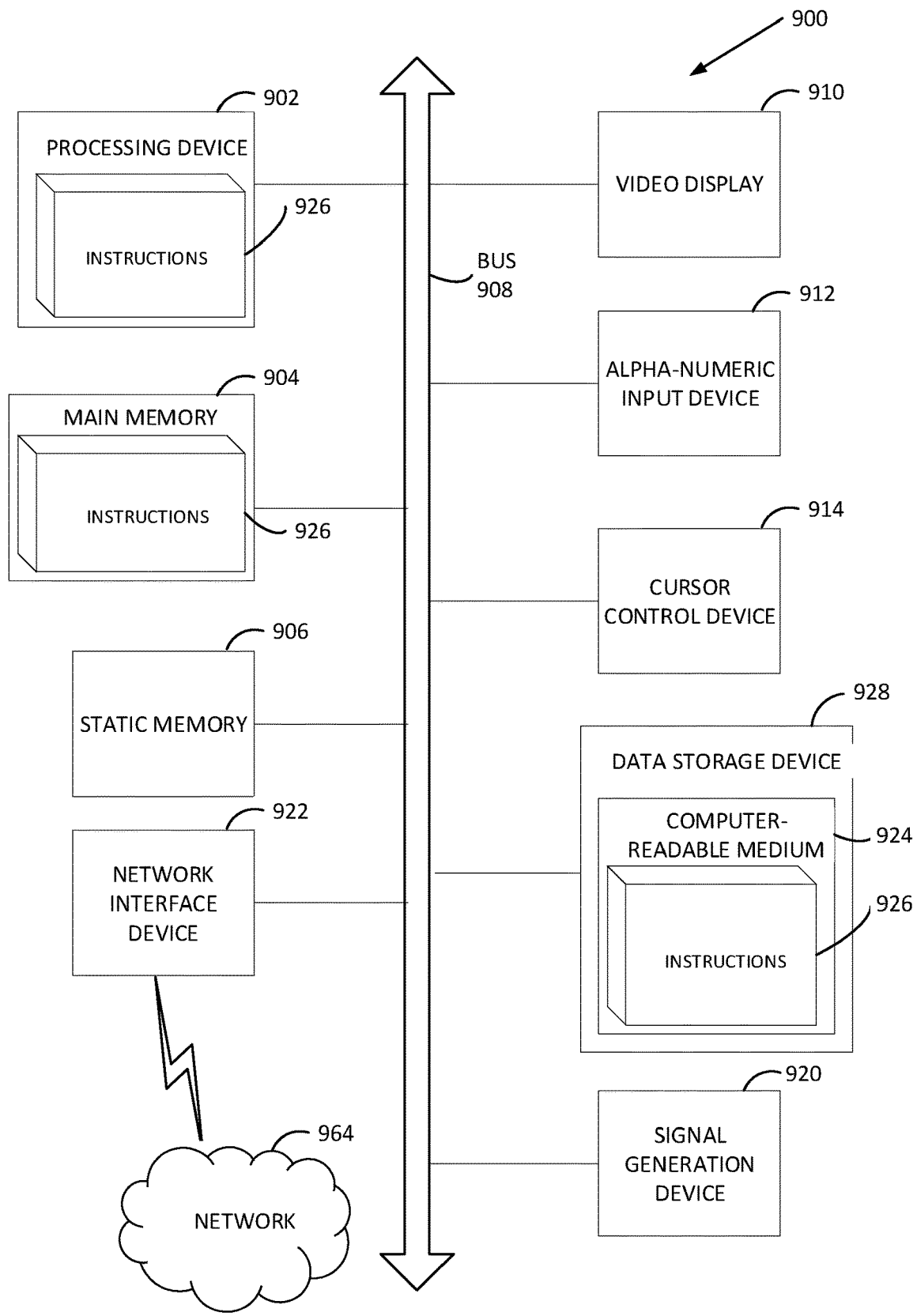
FIG. 9 illustrates a diagrammatic representation of a machine in the example form of a computing device within which a set of instructions for causing the machine to perform any one or more of the methodologies discussed herein can be executed.

FIG. 9 illustrates a diagrammatic representation of a machine in the example form of a computing device within which a set of instructions for causing the machine to perform any one or more of the methodologies discussed herein can be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 900 may correspond to system controller 128 of FIG. 1.

The example computing device 900 includes a processing device 902, a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 928), which communicate with each other via a bus 908.

Processing device 902 may represent one or more general-purpose processors such as a microprocessor, central processing unit, or the like. More particularly, the processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. Processing device 902 may also be or include a system on a chip (SoC), programmable logic controller (PLC), or other type of processing device. Processing device 902 is configured to execute the processing logic (instructions 926) for performing operations and steps discussed herein.

The computing device 900 may further include a network interface device 922 for communicating with a network 964. The computing device 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 920 (e.g., a speaker).

The data storage device 928 may include a machine-readable storage medium (or more specifically a non-transitory computer-readable storage medium) 924 on which is stored one or more sets of instructions 926 embodying any one or more of the methodologies or functions described herein. Wherein a non-transitory storage medium refers to a storage medium other than a carrier wave. The instructions 926 may also reside, completely or at least partially, within the main memory 904 and/or within the processing device 902 during execution thereof by the computer device 900, the main memory 904 and the processing device 902 also constituting computer-readable storage media.

The computer-readable storage medium 924 may also be used to store instructions 926. The computer readable storage medium 924 may also store a software library containing methods that call instructions 926. While the computer-readable storage medium 924 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   moving an object placed on an end effector past a plurality of sensors of a manufacturing system;
   receiving, from the plurality of sensors of the manufacturing system, a first plurality of signals each indicating a current shape of the object placed on the end effector;
   determining whether each of the first plurality of signals correspond to one of a second plurality of signals, wherein each of the second plurality of signals indicate a predefined shape for at least one of a process kit or a process kit carrier; and
   responsive to determining each of the first plurality of signals correspond to a respective signal of the second plurality of signals, determining a correspondence between a center of the object and a center of the end effector, the determined correspondence indicating whether a current placement of the object on the end effector satisfies a target placement criterion.

2. The method of claim 1, wherein determining the correspondence between the center of the object and the center of the end effector comprises:
   identifying, based on each of the first plurality of signals, the center of the object; and
   determining a distance between the center of the object and the center of the end effector,
   wherein the correspondence between the center of the object and the center of the end effector is determined based on the determined distance.

3. The method of claim 2, wherein identifying the center of the object comprises:
   determining, based on each of the first plurality of signals, a first set of coordinates, wherein each of the first set of coordinates correspond to an edge of the object; and
   calculating, based on each of the first set of coordinates, at least a second coordinate corresponding to the center of the object.

4. The method of claim 1, further comprising:
   determining, based on a process recipe, that the object placed on the end effector is expected to comprise at least one of a process kit or a process kit carrier; and
   responsive to determining that one or more of the first plurality of signals indicating the current shape of the object do not correspond to the respective signal of the second plurality of signals indicating the predefined shape for the at least one of the process kit or the process kit carrier, determining that the object does not correspond to the at least one of the process kit or the process kit carrier.

5. The method of claim 1, wherein one or more sensors of the plurality of sensors comprises an emitting element and a receiving element, and wherein a respective sensor is configured to detect the current shape of the object in response to the end effector moving the object between the emitting element and the receiving element.

6. The method of claim 5, wherein determining whether a signal of the first plurality of signals corresponds to the respective signal of the second plurality of signals comprises:
   identifying, based on the signal, a first interval of time that the end effector moves a portion of the object between the emitting element and the receiving element of a first sensor of the plurality of sensors; and
   determining whether the first interval of time corresponds to a second interval of time associated with the respective signal of the second plurality of signals,
   wherein the signal is determined to correspond to the respective signal responsive to a determination that the first interval of time corresponds to the second interval of time.

7. The method of claim 1, further comprising:
   determining, based on the determined correspondence, whether the current placement of the object on the end effector satisfies the target placement criterion; and
   responsive to determining the current placement does not satisfy the target placement criterion, modifying a process recipe associated with the end effector to cause the end effector to place the object at a target location at a station of the manufacturing system.

8. The method of claim 7, further comprising:
   determining whether the current placement of the object on the end effector satisfies a placement correction criterion; and
   responsive to determining the current placement does not satisfy the placement correction criterion, determining the current placement of the at least one of the process kit or the process kit carrier on the end effector cannot be corrected by modifying the process recipe associated with the end effector.

9. The method of claim 1, wherein the object comprises the process kit, the process kit carrier, the process kit coupled to the process kit carrier, or the process kit coupled to the process kit carrier and further comprising a substrate.

10. The method of claim 1, wherein one or more of the plurality of sensors are disposed in a processing chamber of the manufacturing system and the end effector is coupled to a rotating carousel of the processing chamber.

11. A non-transitory computer-readable storage medium comprising instructions that, when executed by a processing device, cause the processing device to perform operations comprising:

moving an object placed on an end effector past a plurality of sensors of a manufacturing system;
receiving, from the plurality of sensors of the manufacturing system, a first plurality of signals each indicating a current shape of the object placed on the end effector;
determining whether each of the first plurality of signals correspond to one of a second plurality of signals, wherein each of the second plurality of signals indicate a predefined shape for at least one of a process kit or a process kit carrier; and
responsive to determining each of the plurality of signals correspond to a respective signal of the second plurality of signals, determining a correspondence between a center of the object and a center of the end effector, the determined correspondence indicating whether a current placement of the object on the end effector satisfies a target placement criterion.

12. The non-transitory computer-readable storage medium of claim 11, wherein to determine the correspondence between the center of the object and the center of the end effector, the processing device is to perform operations comprising:
identifying, based on each of the first plurality of signals, the center of the object; and
determining a distance between the center of the object and the center of the end effector,
wherein the correspondence between the center of the object and the center of the end effector is determined based on the determined distance.

13. A manufacturing system comprising:
a robot arm comprising an end effector; and
a controller operatively coupled to the robot arm, wherein the controller is to perform operations comprising:
moving an object placed on the end effector past a plurality of sensors of a manufacturing system;
receiving, from the plurality of sensors of the manufacturing system, a first plurality of signals each indicating a current shape of the object placed on the end effector;
determining whether each of the first plurality of signals correspond to one of a second plurality of signals, wherein each of the second plurality of signals indicate a predefined shape for at least one of a process kit or a process kit carrier; and
responsive to determining each of the plurality of signals correspond to a respective signal of the second plurality of signals, determining a correspondence between a center of the object and a center of the end effector, the determined correspondence indicating whether a current placement of the object on the end effector satisfies a target placement criterion.

14. The manufacturing system of claim 13, wherein to determine the correspondence between the center of the object and the center of the end effector, the controller is to perform operations comprising:
identifying, based on each of the first plurality of signals, the center of the object; and
determining a distance between the center of the object and the center of the end effector,
wherein the correspondence between the center of the object and the center of the end effector is determined based on the determined distance.

15. The manufacturing system of claim 14, wherein to identify the center of the object, the controller is to perform operations comprising:
determining, based on each of the first plurality of signals, a first set of coordinates, wherein each of the first set of coordinates correspond to an edge of the object; and
calculating, based on each of the first set of coordinates, at least a second coordinate corresponding to the center of the object.

16. The manufacturing system of claim 13, wherein the controller is to perform operations further comprising:
determining, based on a process recipe, that the object placed on the end effector is expected to comprise at least one of a process kit or a process kit carrier; and
responsive to determining that the one or more first plurality of signals indicating the current shape of the object do not correspond to the respective signal of the second plurality of signals indicating the predefined shape for the at least one of the process kit or the process kit carrier, determining that the object does not correspond to the at least one of the process kit or the process kit carrier.

17. The manufacturing system of claim 13, wherein the one or more sensors comprise an emitting element and a receiving element, wherein a respective sensor is configured to detect the current shape of the object in response to the end effector moving the object between the emitting element and the receiving element.

18. The manufacturing system of claim 17, wherein to determine whether a signal of the first plurality of signals corresponds to the respective signal of the second plurality of signals, the controller is to perform operations comprising:
identifying, based on the signal, a first interval of time that the end effector moves a portion of the object between the emitting element and the receiving element of a first sensor of the plurality of sensors; and
determining whether the first interval of time corresponds to a second interval of time associated with the respective signal of the plurality of signals,
wherein the signal is determined to correspond to the respective signal responsive to a determination that the first interval of time corresponds to the second interval of time.

19. The manufacturing system of claim 13, wherein the controller is to perform operations further comprising:
determining, based on the determined correspondence, whether the current placement of the object on the end effector satisfies the target placement criterion; and
responsive to determining the current placement does not satisfy the target placement criterion, modifying a process recipe associated with the end effector to cause the end effector to place the object at a target location at a station of the manufacturing system.

20. The manufacturing system of claim 13, wherein the robot arm is a component of at least one of a factory interface robot of a factory interface at the manufacturing system or a transfer chamber robot of a transfer chamber at the manufacturing system.

* * * * *